(12) United States Patent
Adachi

(10) Patent No.: US 7,022,556 B1
(45) Date of Patent: Apr. 4, 2006

(54) EXPOSURE DEVICE, EXPOSURE METHOD AND METHOD OF MANUFACTURING SEMICONDUCTOR DEVICE

(75) Inventor: Hiroki Adachi, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/437,649

(22) Filed: Nov. 10, 1999

(30) Foreign Application Priority Data

Nov. 11, 1998 (JP) ............................................ 10-321123
Jul. 9, 1999 (JP) ............................................ 11-196734

(51) Int. Cl.
*H01L 21/00* (2006.01)
*H01L 21/336* (2006.01)
*H01L 21/265* (2006.01)

(52) U.S. Cl. ........................ 438/149; 438/158; 438/166; 438/301; 438/486; 438/487; 438/517; 438/535

(58) Field of Classification Search ................. 438/149, 438/166, 486
See application file for complete search history.

(56) References Cited

U.S. PATENT DOCUMENTS

| 4,269,886 A | * | 5/1981 | Bondoc ........................ 428/219 |
| 4,357,557 A | | 11/1982 | Inohara et al. ............... 313/509 |
| 5,072,263 A | | 12/1991 | Watanabe et al. ............. 357/17 |

(Continued)

FOREIGN PATENT DOCUMENTS

| EP | 0 999 595 A2 | 5/2000 |
| JP | 7-130652 | 5/1995 |
| JP | 08-068990 | 3/1996 |
| JP | 08-096959 | 4/1996 |
| JP | 9-312260 | 12/1997 |
| JP | 10-092576 | 4/1998 |
| WO | WO 90/13148 | 11/1990 |

OTHER PUBLICATIONS

Schenk, H. et al, "Polymers for Light Emitting Diodes," *EuroDisplay '99, Proceedings of the 19th International Display Research Conference*, Sep. 6–9, 1999, Berlin, Germany, pp. 33–37.

English abstract re Japanese patent application No. 7–130652, published May 19, 1995.

English abstract re Japanese patent application No. 9–312260, published Dec. 2, 1997.

English abstract re Japanese patent application No. 10–092576, published Apr. 10, 1998.

"Investigation Committee of a Solar Cell,"ed., *Solar Cell Handbook*, Institute of Electrical Engineers of Japan, pp. 164–167 (1985), with concise statement in English.

*Primary Examiner*—Long Pham
*Assistant Examiner*—Shriniivas Rao
(74) *Attorney, Agent, or Firm*—Cook, Alex, McFarron, Manzo, Cummings & Mehler, Ltd.

(57) ABSTRACT

The present invention provides a highly controllable device for exposure from the back side and an exposure method, and also provides a method of manufacturing a semiconductor device using the same. The present invention involves exposure with the use of the back side exposure device of which a reflecting means is disposed on the front side of a substrate, apart from a photosensitive thin film surface by a distance $X(X=0.1$ μm to 1000 μm), and formation of a photosensitive thin film pattern in a self alignment manner, with good controllability, at a position a distance Y away from the end of a pattern. The invention fabricates a TFT using that method.

29 Claims, 20 Drawing Sheets

U.S. PATENT DOCUMENTS

| | | |
|---|---|---|
| 5,107,175 A | 4/1992 | Hirano et al. ................ 313/512 |
| 5,124,204 A | 6/1992 | Yamashita et al. .......... 428/331 |
| 5,189,405 A | 2/1993 | Yamashita et al. .......... 340/781 |
| 5,247,190 A | 9/1993 | Friend et al. ................. 257/40 |
| 5,399,502 A | 3/1995 | Friend et al. .................. 437/1 |
| 5,518,940 A | 5/1996 | Hodate et al. ................ 437/41 |
| 5,530,265 A | 6/1996 | Takemura |
| 5,643,826 A | 7/1997 | Ohtani et al. ................. 437/88 |
| 5,686,360 A | 11/1997 | Harvey, III et al. ........ 437/211 |
| 5,693,956 A | 12/1997 | Shi et al. ...................... 257/40 |
| 5,696,011 A | 12/1997 | Yamazaki et al. |
| 5,757,126 A | 5/1998 | Harvey, III et al. .......... 313/56 |
| 5,771,562 A | 6/1998 | Harvey, III et al. ....... 29/592.1 |
| 5,811,177 A | 9/1998 | Shi et al. .................... 428/209 |
| 5,882,761 A | 3/1999 | Kawami et al. .............. 428/69 |
| 5,923,962 A | 7/1999 | Ohtani et al. ............... 438/150 |
| 5,952,778 A | 9/1999 | Haskal et al. ............... 313/504 |
| 5,962,962 A | 10/1999 | Fujita et al. ................ 313/412 |
| 5,973,258 A | 10/1999 | Shiotsuka et al. .......... 136/252 |
| 5,990,542 A | 11/1999 | Yamazaki .................... 257/642 |
| 6,114,183 A | 9/2000 | Hamada et al. .............. 438/29 |
| 6,146,225 A | 11/2000 | Sheats et al. .................. 445/24 |
| 6,147,451 A | 11/2000 | Shibata et al. .............. 313/506 |
| 6,149,757 A | 11/2000 | Chikaki et al. ............. 156/286 |
| 6,150,187 A | 11/2000 | Zyung et al. ................. 438/26 |
| 6,198,217 B1 | 3/2001 | Suzuki et al. ............... 313/504 |
| 6,198,220 B1 | 3/2001 | Jones et al. ................. 313/512 |
| 6,239,470 B1 | 5/2001 | Yamazaki .................... 257/350 |
| 6,252,248 B1 | 6/2001 | Sano et al. .................... 257/59 |
| 6,268,071 B1 | 7/2001 | Yasukawa et al. .......... 428/690 |
| 6,268,695 B1 | 7/2001 | Affinito ...................... 313/504 |
| 6,274,887 B1 | 8/2001 | Yamazaki et al. ............. 257/72 |
| 6,320,115 B1 | 11/2001 | Kataoka et al. ............. 136/251 |
| 6,323,416 B1 | 11/2001 | Komori et al. .............. 136/259 |
| 6,362,027 B1 * | 3/2002 | Yamazaki et al. .......... 438/149 |
| 6,441,468 B1 | 8/2002 | Yamazaki .................... 257/642 |
| 6,447,867 B1 | 9/2002 | Kominami et al. ........ 428/64.1 |
| 6,784,037 B1 | 8/2004 | Yamazaki et al. .......... 438/199 |

* cited by examiner

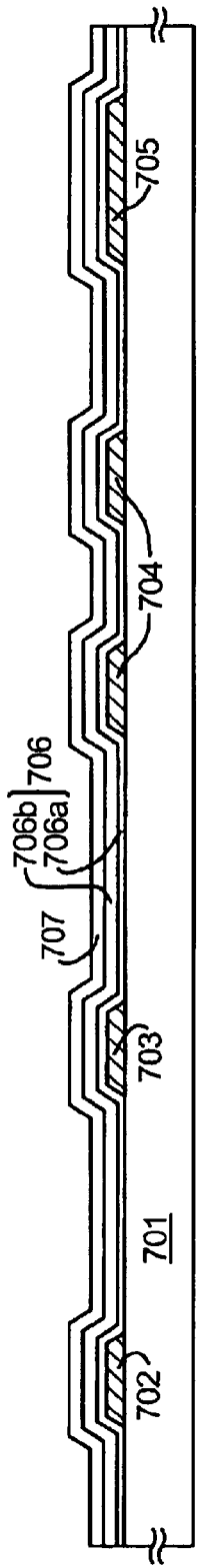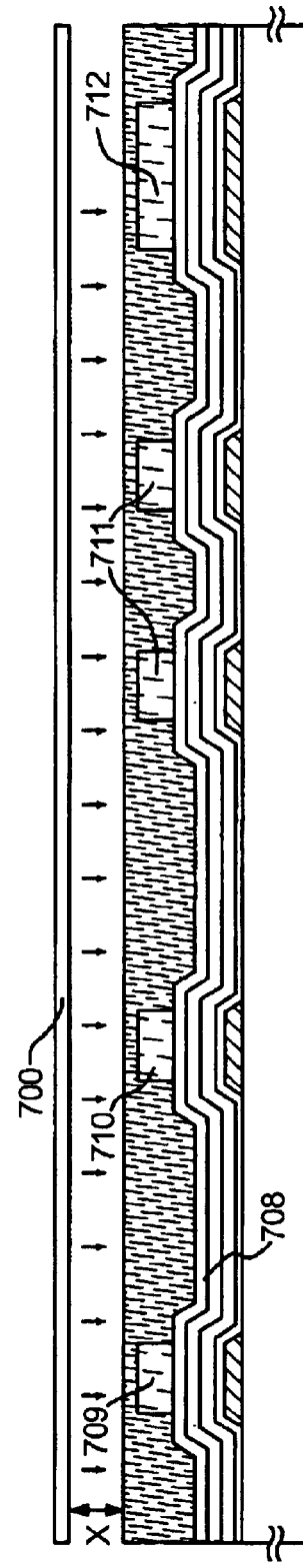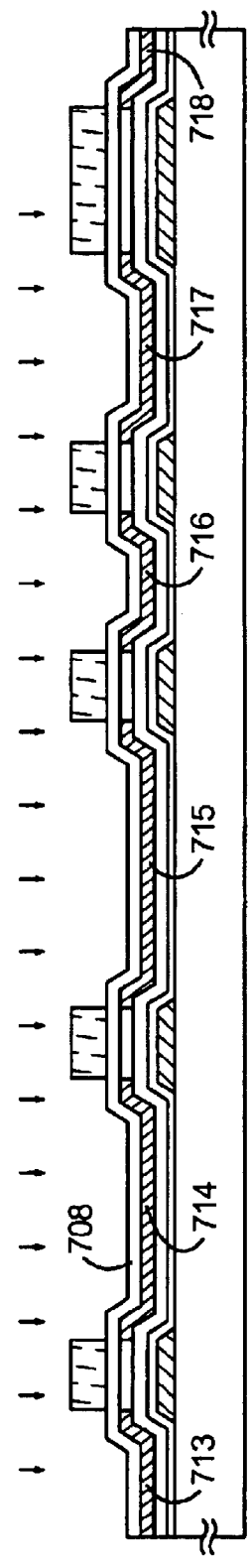

EXPOSURE DEVICE, EXPOSURE METHOD AND METHOD OF MANUFACTURING SEMICONDUCTOR DEVICE

BACKGROUND OF THE INVENTION

1. Field of the Invention

The present invention relates to an exposure device and an exposure method. The invention also relates to a semiconductor device having a circuit that is composed of a thin film transistor (hereinafter referred to as TFT) made by using the exposure method, and to a method of manufacturing the same. The semiconductor device of the present invention includes not only elements such as thin film transistors (TFTs) and MOS transistors but also electrooptical devices, such as display devices and image sensors, having semiconductor circuits composed of those insulating gate type transistors. The semiconductor device of the invention relates to, for example, electrooptical devices typical example of which is a liquid crystal display panel or an electroluminescence (EL) display device and to electronic equipments provided with as their parts such electrooptical devices.

Incidentally, the semiconductor device in this specification refers to devices in general which can function by utilizing semiconductor characteristics. The electrooptical devices, the semiconductor circuits and the electronic equipments are therefore all fall into the semiconductor device.

2. Description of the Related Art

What has been receiving attention is an active matrix liquid crystal display device in which a pixel circuit and a driver circuit are composed of thin film transistors (TFT) formed over an insulating substrate. Liquid crystal displays in use as a display device vary in size, ranging approximately from 0.5 inch to 20 inch.

With the intention of realizing a liquid crystal display device capable of high definition display, attention is presently drawn to a TFT of which an active layer is made of a crystalline semiconductor film represented by a polysilicon film.

However, the TFT having an active layer of crystalline semiconductor film involves a problem in that the TFT is, on one hand high in operation speed and driving performance, but on the other hand large in leak current as compared to a TFT having an active layer of an amorphous semiconductor film.

Known as a technique to suppress this leak current is to form an LDD region between a channel forming region and drain region of the TFT. This LDD region serves to ease the intensity of the electric field formed between the channel forming region and the drain region, reduce OFF current of the TFT and prevent degradation.

In order to form the LDD region between the channel forming region and drain region of the TFT, a mask is used to dope a region to be the drain region with a high concentration of impurity ion for imparting conductivity and to dope a region to be the LDD region with a low concentration of impurity ion for imparting conductivity. As conventional methods for forming a mask used to thus selectively form regions different in dopant concentration, Patterning <1> (non self alignment method) and Patterning <2> (self alignment method) are enumerated. Patterning <1> uses a photo mask and Patterning <2> uses a wiring as a mask to perform exposure from the back side.

The Patterning <1> using a conventional photo mask is briefly described below. When an LDD structure is to be formed, a mask by photolithography is usually employed. The description here is made using a fabricating process of a bottom gate type TFT by way of example.

First, a gate wiring is formed over an insulating substrate. A first photo mask is used at this stage. Then, a gate insulating film and a semiconductor film having an amorphous region are formed over the gate wiring. The semiconductor film having an amorphous region is subjected to crystallizing process through heating, laser beam irradiation or the like to form a crystalline semiconductor film.

A mask pattern is subsequently formed with the use of the Patterning <1>. The Patterning <1> here means to perform the steps of forming an insulating film for the mask pattern, applying a photoresist film onto the insulating film for the mask pattern, forming a photoresist pattern through exposure and development with the use of a second photo mask, etching the insulating film for the mask pattern to form a mask pattern while using the photoresist pattern as a mask, and removing the photoresist pattern. Such a method involving the use of a photo mask is called non self alignment method. Thereafter, the mask pattern is used to selectively dope the crystalline semiconductor film with an impurity ion for imparting conductivity, thereby forming a source region, a drain region, an LDD region or the like.

The problem accompanying this method is that characteristics of TFTs vary because the positioning of the photo mask is uneven in a certain range. High accuracy is required particularly in patterning the mask pattern, which determines the width of a channel forming region.

The Patterning <2> in which a wiring serves as a mask to expose from the back side is described with reference to FIGS. 14A to 14C. As compared with the Patterning <1>, patterning by exposure from the back side can attain higher accuracy. However, in patterning by exposure from the back side in prior art, light goes around and reaches over, resulting in a slightly narrower pattern than the width of the wiring.

First, a gate wiring 11 is formed over an insulating substrate 10. A first photo mask is used at this stage. Then, a gate insulating film 12 and a semiconductor film having an amorphous region are formed over the gate wiring. The semiconductor film having an amorphous region is subjected to crystallizing process through heating, laser beam irradiation or the like to form a crystalline semiconductor film 13.

A mask pattern is subsequently formed with the use of the Patterning <2>. The Patterning <2> here means to perform the steps of forming an insulating thin film 14 for the mask pattern, applying a photoresist film 15 onto the insulating thin film for the mask pattern (FIG. 14A), forming a resist pattern 16 through exposure from the back side with the use of gate wiring as a mask and development (FIG. 14B), etching the insulating film for the mask pattern to form a mask pattern 17 while using the resist pattern as a mask, and removing the resist pattern 16 (FIG. 14C). Formed through this exposure from the back side is the mask pattern 17 which has almost the same size as the gate wiring. In FIGS. 14A to 14C, the end of the resist pattern and the wiring end coincide with each other. However in fact, light rounds to make the mask pattern 17 shorter than the gate wiring, spacing apart their ends by about 0.3 to 0.5 μm.

Such a method that does not use a photo mask is called self alignment method. Thereafter, the mask pattern is used to selectively dope the crystalline semiconductor film with an impurity ion for imparting conductivity, thereby forming a source region, a drain region or an LDD region.

The problem this method <2> gives rise to is that forming the resist pattern as desired is difficult because the resist pattern can be formed only one having almost the same size as the gate wiring used for a mask. Although it is possible to form the resist pattern within the gate wiring area by changing exposure conditions such as exposure time to make the light round, the light reaches over to cause reduction in film thickness of the resist pattern. For that reason, particularly when a minute wiring is used as a mask, the method is not suitable, for a fear that the entire resist over the wiring may be exposed. If the light rounds, it merely reaches somewhere 1 μm far from the end, at most. In addition, to cause the light to round and reach the point about 1 μm far from the end, considerable exposure time and exposure light quantity are required.

Consequently, it has been needed to conduct selective doping using masks by the Patterning <1> and the Patterning <2>when an LDD region is formed in a process of manufacturing a bottom gate type TFT.

SUMMARY OF THE INVENTION

The present invention has been made to solve the above problems inherent in prior art, and therefore an object of the present invention is to provide a novel exposure device that forms a mask pattern in a self alignment manner.

Another object of the present invention is to provide the structure of a display device employing a TFT and a method of manufacturing the same, the TFT being fabricated by forming a mask pattern in a self alignment manner through an exposure method with the use of the exposure device of the present invention to form an LDD region over a gate wiring.

In order to attain the objects above, the present invention is characterized in that an exposure device of which a reflecting plate is arranged on the front side of a substrate and apart from a photosensitive thin film surface by a distance X(0.1 μm to 1000 μm) is used to perform exposure from the back side, thereby forming a mask pattern in a self alignment manner.

According to the structure of the present invention, to be disclosed in this specification, an exposure device is characterized by comprising:

a stage for placing a light transmissive substrate on which a photosensitive thin film is formed;

a light source for irradiating the photosensitive thin film from the back side of the light transmissive substrate; and a reflecting means disposed on the front side of the light transmissive substrate.

In the structure above, the device is characterized in that the reflecting means is a substrate provided with a thin film made of a material with reflectivity.

In the structure above, the photosensitive thin film is a photoresist film.

In the structure above, the device is characterized in that the photosensitive thin film is formed on a pattern made of a non-light-transmissive (light-shielding) thin film material.

In an exposure method of the present invention, light from the light source penetrates the substrate from its back side to be irradiated onto the photosensitive thin film (except for a region over a gate wiring). The light from the light source which has penetrated the photosensitive thin film is reflected or scattered by the reflecting plate disposed on the front side of the substrate, and is irradiated onto the (entire) photosensitive thin film from the front side of the substrate. A region of the photosensitive thin film which is irradiated with only a minute quantity of this reflected or scattered light is utilized to form a mask pattern. Because of this region irradiated with only a minute quantity of the reflected or scattered light, of which position can be determined by suitably changing the distance X(0.1 μm to 1000 μm between the photosensitive thin film surface and the reflecting plate, a mask pattern of a desired size may be formed over the gate wiring in a self alignment manner.

According to the structure of the present invention, an exposure method with the use of the above exposure device is characterized by comprising the steps of:

forming on a light transmissive substrate a pattern made of a non-light-transmissive (light-shielding) thin film material;

forming a photosensitive thin film on the pattern; and exposing the photosensitive thin film by irradiating it from the back side of the substrate with light emitted from a light source while using the pattern as a mask, and reflecting or scattering by a reflecting means, which is disposed on the front side of the substrate, the light from the light source which has penetrated through the photosensitive thin film, so that the photosensitive thin film is irradiated from the front side of the substrate with the light and is exposed.

In the structure above, the exposure method is characterized in that the shape of the photosensitive thin film formed over the pattern corresponds to a reduced shape of the pattern made of the non-light-transmissive (light-shielding) thin film material.

The mask pattern formed through the exposure method of the present invention, or a doping mask made of an insulating film formed with the use of the mask pattern as a mask, is used to selectively add an impurity ion for imparting conductivity, thereby forming an LDD region.

Incidentally in this specification, one substrate side on which the TFT is fabricated is regarded as the front side, and its side opposite to the front side is regarded as the back side.

A substrate regarded as a light transmissive substrate in this specification is one having a transmittance of 60% or more, preferably 80% or more with respect to light from the light source of the exposure device.

A material that may be used as the reflecting means is a substrate (reflecting plate) with a highly reflective metal film, such as an aluminum film or a silver film, having a reflectance of 80% or more with respect to the wavelength of light from the light source of the exposure device.

The "dopant" designates in this specification an element that belongs to the group XIII or XV, unless particularly notified. Regardless of the fact that each doped region changes its size (area) during the manufacturing process, the impurity regions are denoted by the same reference symbols in this specification as long as the concentration is not changed following the change in the area.

BRIEF DESCRIPTION OF THE DRAWINGS

In the accompanying drawings:

FIGS. 7A to 7C are views showing an example of a manufacturing process of the present invention (Embodiment 5);

DESCRIPTION OF THE PREFERRED EMBODIMENT (Embodiment Mode 1)

Hereinbelow, a description will be made on an example of an embodiment mode of the present invention with reference to FIG. 6.

Figure 6:
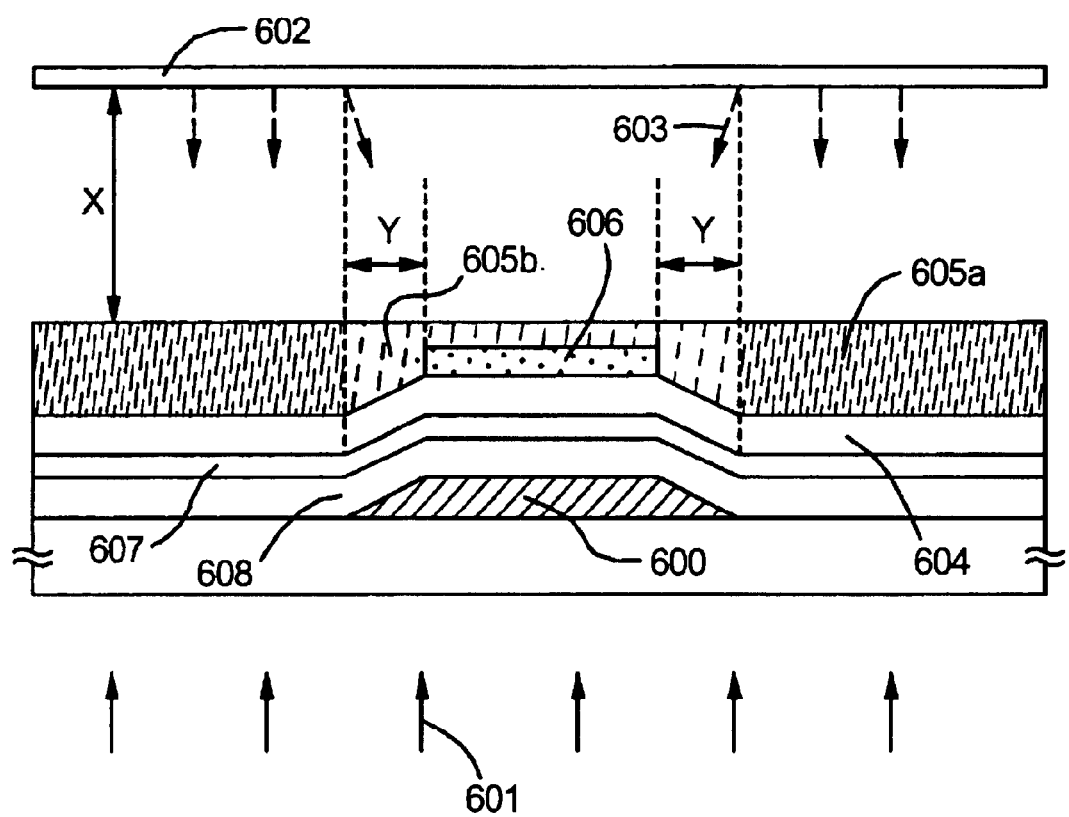
FIG. 6 shows an exposure device of the present invention.

As shown in FIG. 6, an exposure device of the present invention comprises: a stage for placing a light transmissive substrate on which a photosensitive thin film is formed; a light source for exposing the photosensitive thin film to light; and a reflecting means disposed on the front side of the light transmissive substrate. A substrate on which a metal thin film with reflectivity is formed (reflecting plate), a mirror or a light scattering plate is used as a reflecting means 602, and arranged in parallel to the substrate surface. A distance X between the reflecting means and the photosensitive thin film surface is adjusted within a range of from 0.1 μm to 1000 μm, thereby controlling a distance Y for light to round.

In an exposure method of the present invention, light 601 from the light source which has penetrated the photosensitive thin film is reflected or scattered by the reflecting means 602 disposed on the front side of the substrate, so that the photosensitive thin film is selectively exposed from the front side of the substrate. This causes the light to round and reach onto a pattern 600 made of a non-light-transmissive (light-shielding) material, forming a mask with good controllability.

A brief description will be given on the exposure method of the present invention.

Explained here is a case in which, of a photosensitive thin film formed above the pattern 600 made of a non-light-transmissive (light-shielding) material, regions excluding a region denoted by 606 (having a pattern apart from the end of the pattern 600 by the distance Y) are exposed.

First, the photosensitive thin film is exposed from the back side with the light 601 from the light source using the pattern 600 as a mask, and a region denoted by 605a is exposed. The light which has penetrated the region denoted by 605a is then reflected or scattered by the reflecting means 602 to become light 603. The photosensitive thin film is again exposed with this reflected or scattered light 603 to expose regions denoted by 605a and 605b. Accordingly, the region denoted by 605a is exposed twice. When only the region denoted by 605a is intended to be exposed, exposure may thus completed in a short period of time and throughput may be improved.

Thereafter, the exposed regions 605a and 605b are removed, with an unexposed region denoted by 606 left alone. Thus formed is the mask 606 (having a pattern apart from the end of the pattern 600 by the distance Y).

The use as a mask of the region formed through the above steps and denoted by 606 allows to selectively etch the thin film 604. The utilization of this region 606 as a mask also makes possible the through doping of a semiconductor film 607. Incidentally, reference symbol 608 in FIG. 6 denotes an insulating film.

The exposure method of the present invention may be applied to the case where the mask is formed over the pattern 600 made of a non-light-transmissive (light-shielding) material, without particular limitation. The pattern 600 functions right if it is made of a material film having a film thickness enough to exhibit light shielding property.

(Embodiment Mode 2)

A detailed description will be made below on an example of an embodiment mode according to the present invention, with reference to FIGS. 1A to 1E. For the purpose of simplification, a manufacturing method using an n-channel TFT will be explained.

A substrate is first prepared. Usable substrate as a substrate 100 includes an insulating substrate such as a glass substrate, a quartz substrate or a crystalline glass substrate, and a substrate having light transmittance such as a plastic substrate (polyethylene terephtalate substrate).

Next, a base insulating film (hereinafter, referred to as base film) 101 is formed on the substrate and thermally processed. This base film 101 may be a silicon oxide film, a silicon nitride film or a silicon nitride oxide film (SiOxNy), or may be a laminate film of those. The film thickness of the base film ranges from 100 nm to 500 nm. As formation method of the base film, thermal CVD, plasma CVD, sputtering, evaporation, low thermal pressure CVD, or the like may be used. This base film has an effect of preventing diffusion of a dopant from the substrate. Incidentally, this base film intended to improve electric characteristic of the TFT is not necessarily formed.

A conductive film made of a non-transmissive conductive material (a material layer for gate wiring formation) is then formed on the insulating film 101 to form a gate wiring 102 by a known patterning method.

A conductive material or a semiconductor material is used for that conductive film. Examples of these materials include a single metal layer consisting of a layer that contains as a main ingredient tantalum (Ta), tantalum nitride (TaN), aluminum (Al), copper (Cu), niobium (Nb), hafnium (Hf), zirconium (Zr), titanium (Ti), chromium (Cr), tungsten (W), molybdenum (Mo) or silicon (Si), and a laminate structure in which those are combined. As a representative example of the laminate structure, Ta/Al, Ti/Al, Cu/W, Al/W, W/Mo and so on may be enumerated. Also may be used the structure provided with metal silicide (specifically, the structure in which metal silicide is combined with silicon having conductivity such as Six, Si/TiSix, Si/CoSix or Si/MoSix). The film thickness of the conductive film ranges from 10 nm to 500 nm.

Subsequently, an insulating film 103 for protecting the surface of the gate wiring is formed. The film 103 is preferably an anodic oxidation film formed through anodic oxidation of the gate wiring, or is a thin silicon nitride film covering the entire surface of the gate wiring.

A gate insulating film 104' is next formed. Usable films for the gate insulating film 104' include a silicon oxide film, a silicon nitride film, a silicon nitride oxide film (SiOxNy), an organic resin film (BCB (benzocyclobutene), etc.), and a laminate film of those. The gate insulating film is formed through a known method such as thermal CVD, plasma CVD, low thermal pressure CVD, sputtering, evaporation or coating, in a film thickness range of from 10 nm to 400 nm.

Next, a semiconductor film is formed on the gate insulating film 104'. An example of the semiconductor film includes an amorphous silicon film, an amorphous semiconductor film containing microcrystal, a microcrystal semiconductor film, an amorphous germanium film and an amorphous silicon germanium film expressed as $Si_xGe_{1-x}$ (0<X<1), and a laminate film of those. The film thickness thereof varies from 20 nm to 70 nm (typically, 40 to 50 nm). The semiconductor film is formed through thermal CVD, plasma CVD, low thermal pressure CVD, sputtering or the like.

Figure 1A:
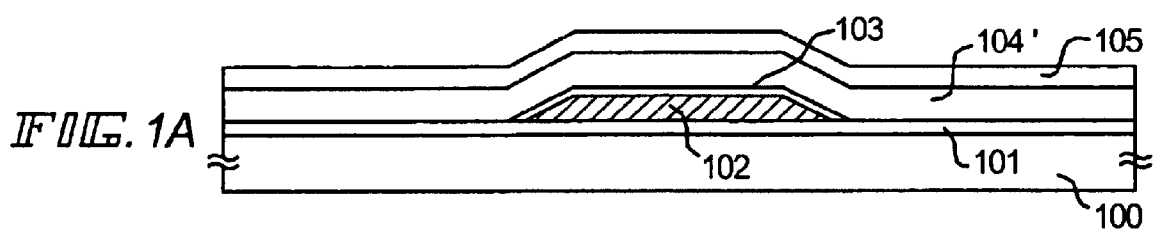
FIGS. 1A to 1E are views showing an example of a manufacturing process of the present invention (Embodiment 1)

Then a crystallization processing is performed on the semiconductor film having an amorphous region to form a crystalline semiconductor film 105 (FIG. 1A).

The crystallization processing according to the present invention may employ any known methods, for example, crystallization processing by infrared rays or ultraviolet rays irradiation (hereinafter referred to as laser crystallization), laser crystallization using a catalytic element, thermal crystallization, and thermal crystallization using a catalytic element. Also, the crystallization processing may be used in combination.

The laser crystallization is in particular effective, for it imparts less stress on the substrate and takes a short period of time to process. When ultraviolet rays are used for crystallization processing, excimer laser light or intense light emitted from an ultraviolet lamp may be employed, and when infrared rays are used, an infrared laser beam or intense light emitted from an infrared lamp will do. Incidentally, it is possible to irradiate laser beam shaped into a linear (several mm width×several tens cm length), rectangular or square beam by a pulse laser using XeCl, ArF, KrF, etc. as gas for laser, a continuous wave laser such as an Ar laser, or YAG laser (second, third, fourth etc. harmonics).

Conditions on the laser crystallization (the shape of the laser beam, laser beam wavelength, overlap ratio, irradiation intensity, pulse width, repetition frequency, irradiation time, etc.) may be suitably determined while taking into consideration the film thickness of the semiconductor film, substrate temperature or the like. Depending on the laser crystallization condition, there are some cases in which the semiconductor film is crystallized after it passes its melted state, and in which the semiconductor film is crystallized while it is in a solid phase state without melting or in a middle state between solid phase and liquid phase. Moreover, it is also possible to complete formation of the semiconductor film, formation of the insulating film and laser crystallization of the semiconductor film within the same chamber, avoiding exposure to the air.

The thermal crystallization including addition of a catalytic element (nickel) for promoting crystallization is described in detail in, for example, Japanese Patent Application Laid-open Nos. Hei 7-130652, which corresponds to U.S. Pat. No. 5,643,826 and Hei 9-312260 which corresponds to a pending U.S. application Ser. No. 08/785,489. An entire disclosure of JP 7-130652, 9-312260, and U.S. application Ser. No. 08/785,489 and U.S. Pat. No. 5,643,826 is incorporated herein by reference. Used as a metal element for promoting crystallization is one or plural kinds of element selected from a group consisting of Fe, Co, Ni, Ru, Rh, Pd, Os, Ir, Pt, Cu and Au. Ge and Pb which are substitution type in diffusing through an amorphous silicon film may also be used.

Note that, in the laser crystallization using a catalytic element or the thermal crystallization using a catalytic element, after the catalytic element is added onto the base film, the semiconductor film is formed and thereafter the semiconductor film is crystallized. When crystallization is performed with the use of a catalytic element, a high concentration of catalytic element is remained in the semiconductor film. It is therefore preferable to perform after crystallization processing a step of reducing the concentration of the catalytic element in the semiconductor film, such as gettering processing.

Then, a mask pattern will then be formed using a patterning method of the present invention shown below.

An insulating thin film 106 is first formed on a semiconductor film 105. Usable films for the insulating thin film 106 include a silicon oxide film, a silicon nitride film, a silicon nitride oxide film (SiOxNy), an organic resin film (BCB (benzocyclobutene), etc.), and a laminate film of those. The insulating thin film 106 is formed through a known method such as thermal CVD, plasma CVD, low thermal pressure CVD, sputtering, or evaporation, in a film thickness range of from 10 nm to 200 nm. This insulating thin film 106 is to enhance adherence to a photosensitive thin film that will be laminate in a following step and, at the same time, to protect the semiconductor film, especially, a region to be a channel forming region against contamination.

Figure 1B:
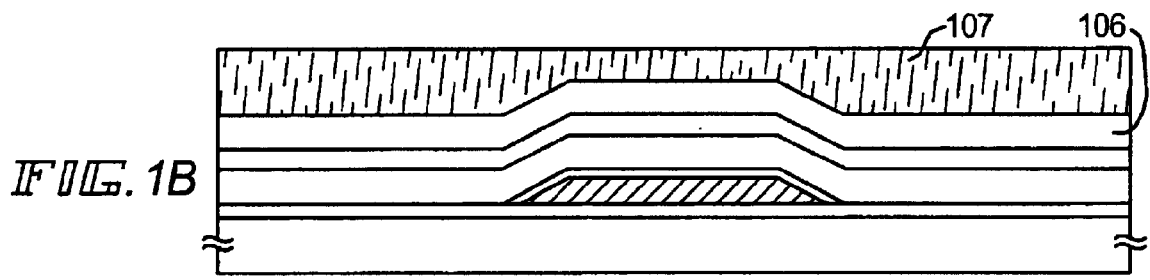

A photosensitive thin film 107 is next formed over the insulating thin film (FIG. 1B). The photosensitive thin film 107 may be made of positive photoresist, negative photoresist, photosensitive polyimide or the like. A known method such as coating is applied to a formation method of the photosensitive thin film 107. The film thickness of the photosensitive thin film is, though not particularly limited as thin as the film allows ultraviolet rays to transmit, in a range of from 0.25 μm to 4 μm, preferably from 1 μm to 2 μm.

Exposure is then carried out using a device for exposure from the back side in which a reflecting plate 108 is disposed in parallel with the substrate surface (distanced by a distance $X_1$ from the photosensitive thin film surface ($X_1$=0.1 to 1000 μm)). The exposure method of the present invention is characterized in that light from the light source which has penetrated the photosensitive thin film is reflected or scattered by the reflecting plate 108 disposed on the front side of the substrate to ununiformly irradiate the entire surface of the photosensitive thin film. The light from the light source penetrates the substrate from the back side to irradiate the photosensitive thin film (excluding a region over the gate wiring).

Figure 1C:
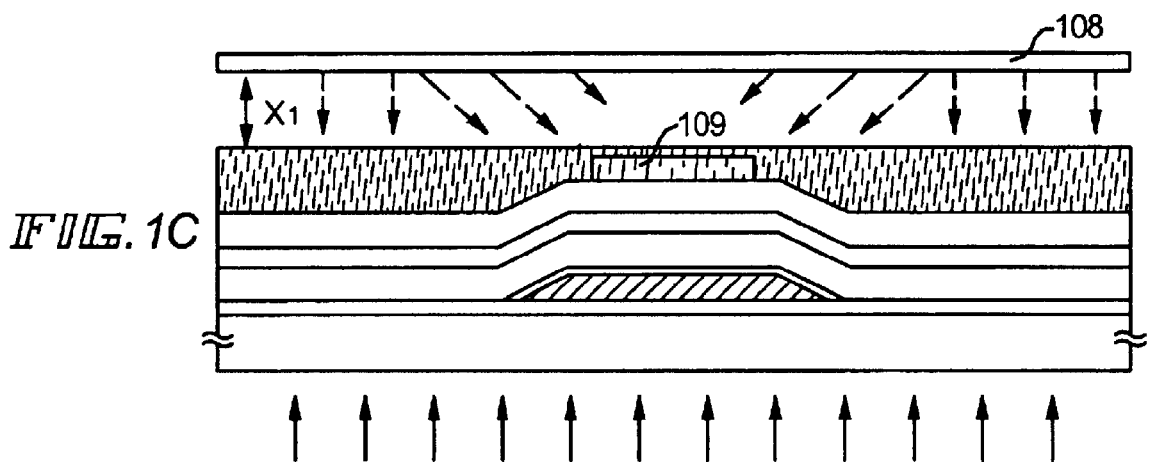
Figure 1D:
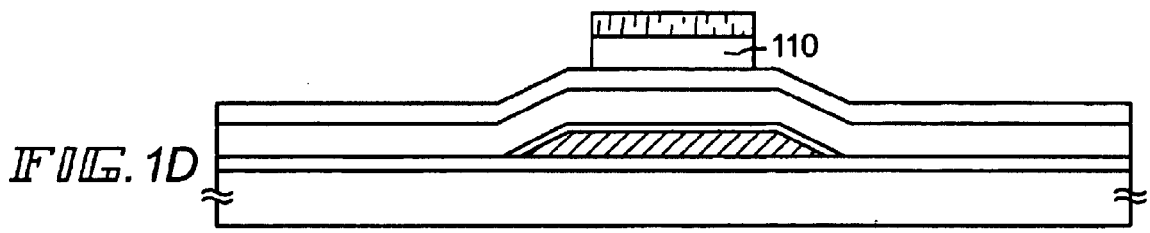
Figure 1E:
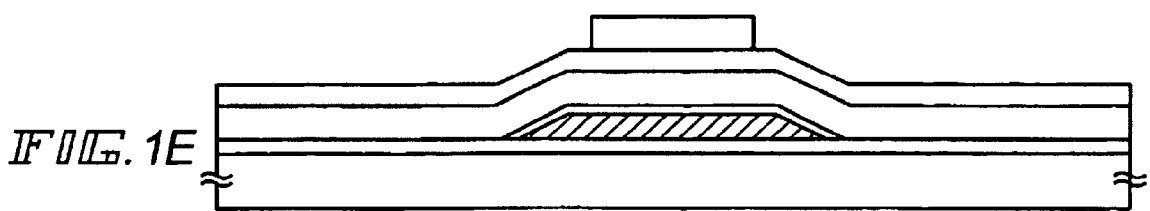

Namely, a region irradiated with only a minute quantity of light reflected or scattered by the reflecting plate 108 is used to obtain a first photosensitive thin film pattern 109 having a smaller size than the size of the gate wiring (FIG. 1C). The reduction ratio of the photosensitive thin film pattern 109 as compared with the size of the gate wiring 102 may be suitably adjusted by changing the distance $X_1$ (distance between the photosensitive thin film surface and the reflecting plate), exposure quantity, exposure time, etc. This first photosensitive thin film pattern 109 is used as an etching mask to selectively etch the insulating thin film 106, thereby forming an insulating thin film pattern 110 over a region to be the channel forming region (FIG. 1D). After that, the first photosensitive thin film pattern 109 is removed (FIG. 1E).

Through the steps above, a pattern can be formed in a self alignment manner over the gate wiring.

Another photosensitive thin film is then formed with the use of a self alignment method similar to the above described exposure from the back side, and exposure from the back side is conducted one more. Through this second exposure from the back side, a second photosensitive thin film pattern is formed so that the size thereof is smaller than the size of the gate wiring pattern and larger than the first photosensitive thin film pattern 109 by adjusting a distance $X_2$, exposure quantity, exposure time, etc.

A high concentration of dopant for imparting p-type or n-type conductivity is then added using the second photosensitive thin film pattern and the insulating thin film pattern as masks. In this way, a region selectively doped with the dopant for imparting conductivity becomes a source region or a drain region.

After removing the second photosensitive thin film pattern, a low concentration of dopant for imparting p-type or n-type conductivity is then added using the insulating thin film pattern as a mask. A lightly doped region (LDD region) is thus formed between the heavily doped region (source region/drain region) and the channel forming region.

Accordingly, the size of the channel forming region is determined by the first photosensitive thin film pattern, and the size of the LDD region is determined by the second photosensitive thin film pattern. The photosensitive thin film patterns formed by the patterning method of the present invention are formed only over the gate wiring, overlapping the LDD region with a gate electrode (which is the structure so-called the GOLD structure). Degradation of ON current in the TFT is thus suppressed to improve reliability. For example, width of the LDD region can be set to 1.0 to 4.0 μm.

An offset region may be formed instead of the LDD region. Further, it is also possible to repeat a plurality of times the patterning in accordance with the patterning method of the present invention to form the LDD region and the offset region. In addition, it is also possible to form, other than the channel forming region, at least three kinds or more of doped regions containing the same dopant in different concentrations by repeating appropriate number of times both the patterning according to the patterning method of the present invention and doping with dopants.

The patterning of the present invention may be used in combination with a known patterning method using a photo mask and a known patterning method involving exposure from the back side.

Though shown here is an example of forming the LDD region of the bottom gate type TFT, the invention may be applied to the top gate structure (representatively, the planer structure) without any particular limitation, if the mask is patterned over the pattern made of a non-transmissive material. For instance, the invention may also be applied to patterning of an insulating film having over its lower layer a pattern made of a non-transmissive material, and to a patterning of an active layer.

The use of the device according to the present invention allows to perform exposure from the back side even with a minute wiring.

The present invention comprised of the structures above will be described in further detail with embodiments shown below.

Hereinafter, embodiments of the present invention are described but, needless to say, are not intended to limit the invention thereto.

[Embodiment 1]

This embodiment takes an example of fabricating a CMOS circuit, which constitutes a part of a peripheral driver circuit, and a pixel TFT, which constitutes a part of a pixel portion, over the same substrate, using the present invention. Explanation is briefly given below with reference to FIGS. 1A to 5B, which are simplified sectional views showing a semiconductor device of the present invention and a method of manufacturing the same. For the purpose of simplification, an n-channel TFT is used for the detailed description on the manufacturing method in this embodiment.

First, a light transmissive substrate 100 is prepared. A glass substrate (Corning 1737; with a strain point of 667° C.) is used as the substrate 100 in this embodiment. A base insulating film (hereinafter in this specification, referred to as base film) is formed on the substrate 100 and then thermally processed. The thermal processing here is performed at a temperature below the strain point of the substrate, preferably at 200 to 700° C. In this embodiment, the base film 101 is formed such that, using TEOS and oxygen ($O_2$) for row material gas, a silicon oxide film with a thickness of 200 nm is formed by a plasma CVD apparatus and then is thermally processed at 640° C. for 4 hours.

Next, a conductive film is formed on the base film 101 and is patterned to form a gate wiring. Though not shown in this embodiment for simplification, a gate wiring 102 is formed by forming a laminate film consisting of a tantalum nitride film with a thickness of 50 nm and a tantalum film with a thickness of 250 nm, and then conducting a normal patterning using a photo mask. In this embodiment, the gate wiring is subjected to anodic oxidation treatment to form a protective film 103 of the gate wiring. Providing this protective film uniforms crystal grain size formed at a later step of crystallizing the semiconductor film.

Then, a gate insulating film 104' is formed to cover the gate wiring 102 and its protective film 103. The gate insulating film 104' in this embodiment is a silicon oxide film having a thickness of 125 nm and formed by plasma CVD.

Subsequently, a semiconductor film is formed over the gate insulating film 104'. In this embodiment, the semiconductor film is an amorphous silicon film having a thickness of 55 nm and formed by plasma CVD.

The semiconductor film, that is, an amorphous silicon film is then crystallized. The film is irradiated in this embodiment with excimer laser beam to form a crystalline silicon (semiconductor) film 105 (FIG. 1A).

An insulating thin film 106 is next formed on the crystallized semiconductor film 105. In this embodiment, the insulating thin film 106 is a silicon oxide film having a thickness of 200 nm and formed by plasma CVD. Though used in this embodiment is a silicon oxide film, any insulating film may be used without particular limitation.

Next on the insulating thin film 106, a first photosensitive thin film 107 is formed. As formation method of the first photosensitive thin film in this embodiment, coating is used and a positive photoresist film (a product of Tokyo Ohka Kogyo, TSMR 8900, 45cP) is formed in a film thickness of 2.3 µm (FIG. 1B).

Then using a back side exposure device in which a reflecting plate 108 (apart from the first photosensitive thin film surface by a distance $X_1$) disposed in parallel with the substrate surface, a first back side exposure is performed in a self alignment manner (here, exposure light quantity is 10 mW) (FIG. 1C). In this embodiment, the Kapton Tape with a thickness of 1.0 µm is interposed between the reflecting plate 108 and the substrate so that the distance $X_1$ between the first photosensitive thin film surface and the reflecting plate 108 shown in FIG. 1C is 1.0 µm. Ultraviolet rays from the light source penetrate through the substrate from the back side to expose the first photosensitive thin film (excluding the region on the gate wiring), and the light is reflected or scattered by the reflecting plate disposed on the front side of the substrate to expose the entire surface of the first photosensitive thin film from the front side of the substrate. The film is thereafter developed to selectively remove the photosensitive thin film exposed to the ultraviolet rays, leaving a first photoresist pattern 109 that is smaller in size than the gate wiring pattern.

Subsequently, the insulating thin film 106 is selectively removed using the first photoresist pattern 109 as an etching mask, to form an insulating thin film pattern 110 (FIG. 1D).

The first photoresist pattern 109 is then removed (FIG. 1E).

A second photosensitive thin film 111 is next formed, and a second exposure from the back side is conducted using the method of self alignment manner as in the first exposure from the back side. In this embodiment, the same material that forms the first photosensitive thin film is used for the second photosensitive thin film 111, and the distance $X_2$ between the second photosensitive thin film surface and the reflecting plate is adjusted to 0.5 µm to perform the second exposure from the back side (exposure light quantity here is 10 mW) (FIG. 2B). This second exposure from the back side leaves a second photoresist pattern 112 smaller in size than the gate wiring pattern and larger than the first photoresist pattern 109.

Next, a high concentration of dopant for imparting n-type conductivity is added using the second photoresist pattern 112 and the insulating thin film pattern 110 as masks. In this way, a region 113 selectively doped with a high concentration of dopant for imparting conductivity becomes a source region or a drain region (FIG. 2C).

Figure 3A:
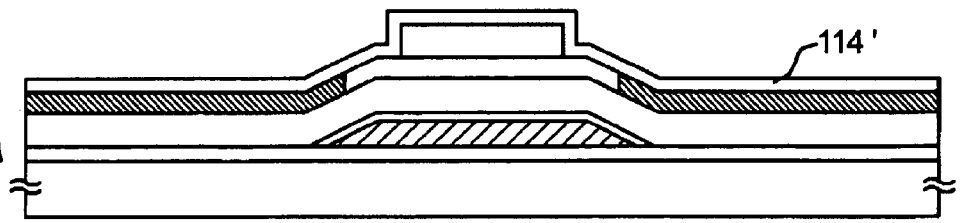
FIGS. 3A to 3C are views showing an example of the manufacturing process of the present invention (Embodiment 1)

After that, the second photoresist pattern 112 is removed (FIG. 2D) to form a thin silicon oxide film 114' (50 nm) (FIG. 3A). This silicon oxide film 114' is a film to add a low concentration of dopant with good controllability, and is not necessarily formed. Though a silicon oxide film is used in this embodiment, other insulating material film such as a silicon nitride film and a silicon oxide nitride film may be used.

Subsequently, a dopant for imparting n-type conductivity is added through the thin silicon oxide film 114' to form regions 116, 117 selectively doped with a low concentration of dopant. The insulating thin film pattern 110 serves as a mask for protecting the channel forming region. In this way, the lightly doped regions (LDD regions) 116, 117 are formed between heavily doped regions (source region/drain region) 118', 119' and a channel forming region 115. In this embodiment, the size of the channel forming region is determined by the first resist pattern 109, and the second resist pattern 112 determines the size of the LDD region.

Figure 3B:
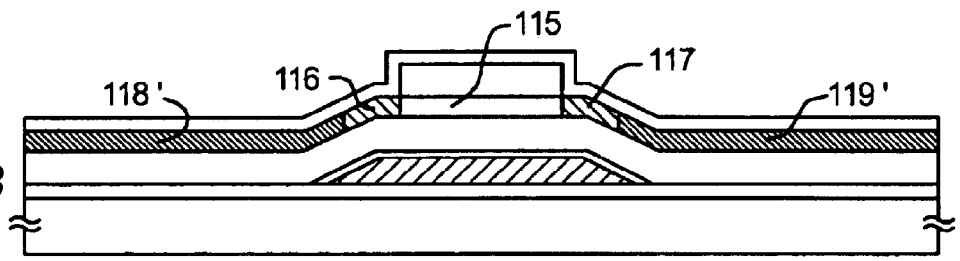

In this embodiment, phosphorus elements are used as the dopant for imparting n-type conductivity. Doping conditions, dose and acceleration voltage are adjusted so that the phosphorus concentration when analyzed by SIMS is $1\times10^{15}$ to $1\times10^{17}$ atoms/cm$^3$ in the lightly doped regions denoted by 116, 117 and $1\times10^{20}$ to $8\times10^{21}$ atoms/cm$^3$ in the heavily doped regions denoted by 118', 119' (FIG. 3B).

Figure 3C:
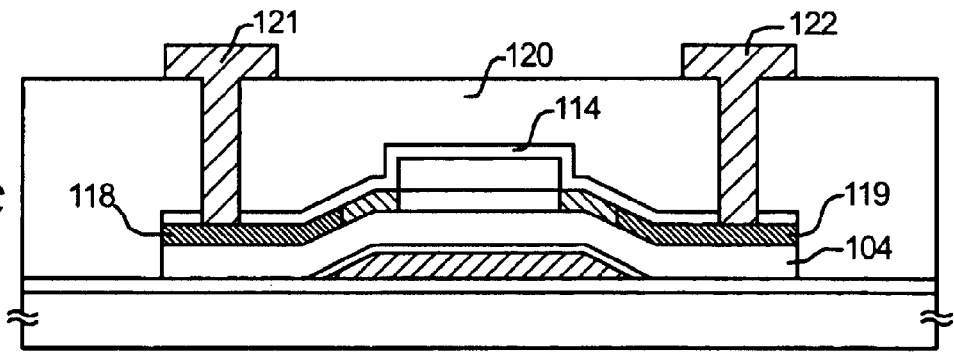

Thermal annealing or laser annealing is thereafter carried out to activate the dopant for imparting n-type conductivity. In this embodiment, the activation is made by laser annealing. A normal patterning including the use of a photo mask is then performed obtaining a desired shape, to thereby form a thin silicon oxide film 114, semiconductor films 115 to 119 and a gate insulating film 104. An interlayer insulating film 120 is next deposited, and after forming a contact hole for exposing the source region and the drain region, a metal film is formed and patterned to form metal wirings 121, 122 that are in contact with a source region 118 and a drain region 119. The manufacturing process of the n-channel TFT is thus completed (FIG. 3C).

Shown in this embodiment is a method of manufacturing the n-channel TFT. When the p-channel TFT is to be fabricated, boron ions for imparting p-type is added in the above doping step, instead of impurity ions for imparting n-type. The present invention may be applied to a CMOS circuit that is composed of complementally combined n-channel TFT and p-channel TFT, or to a pixel TFT comprised of the n-channel TFT.

Figure 4:
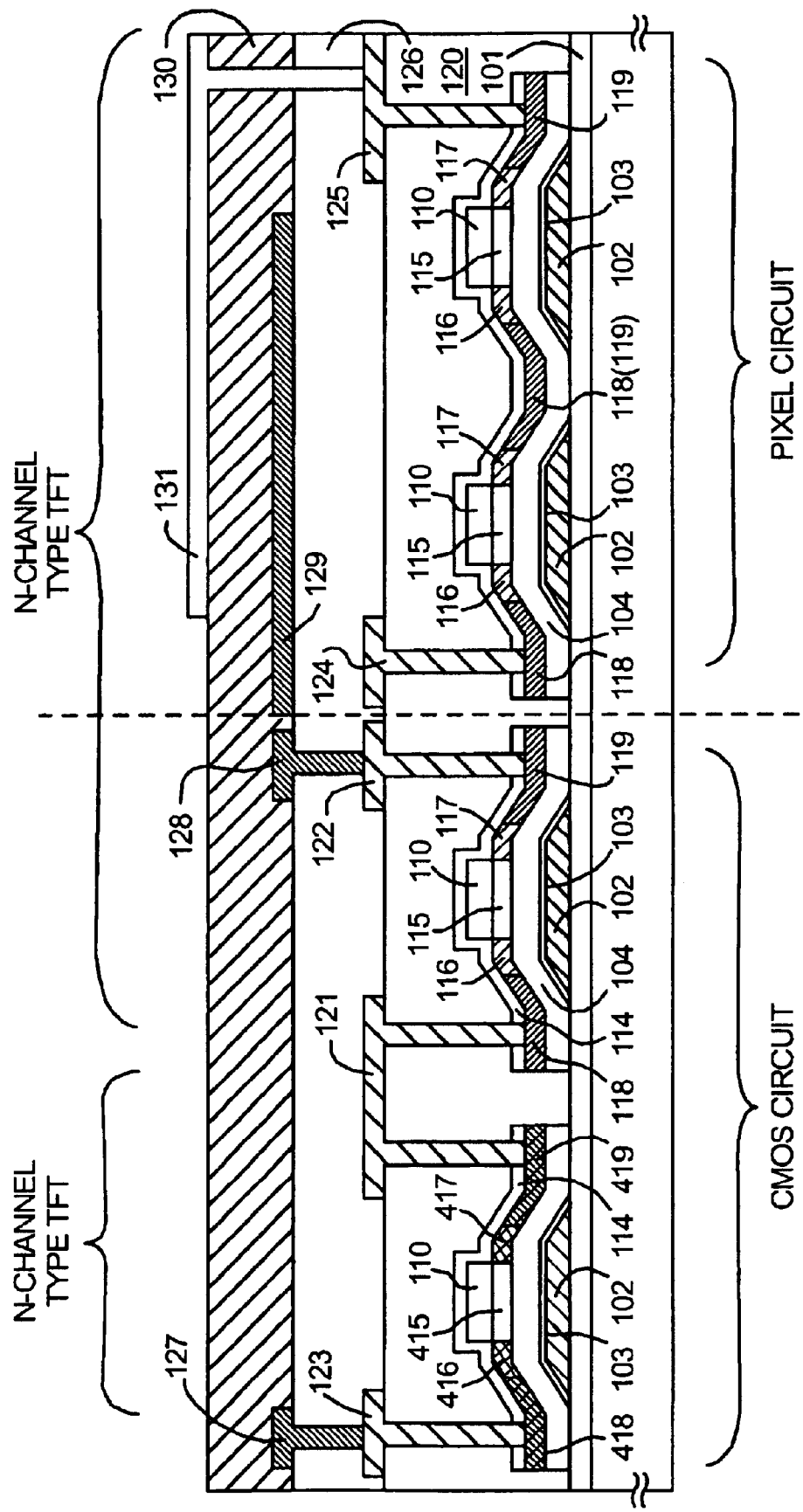
FIG. 4 is a sectional view showing an example of the structure of the present invention (Embodiment 1)
Figure 5A:
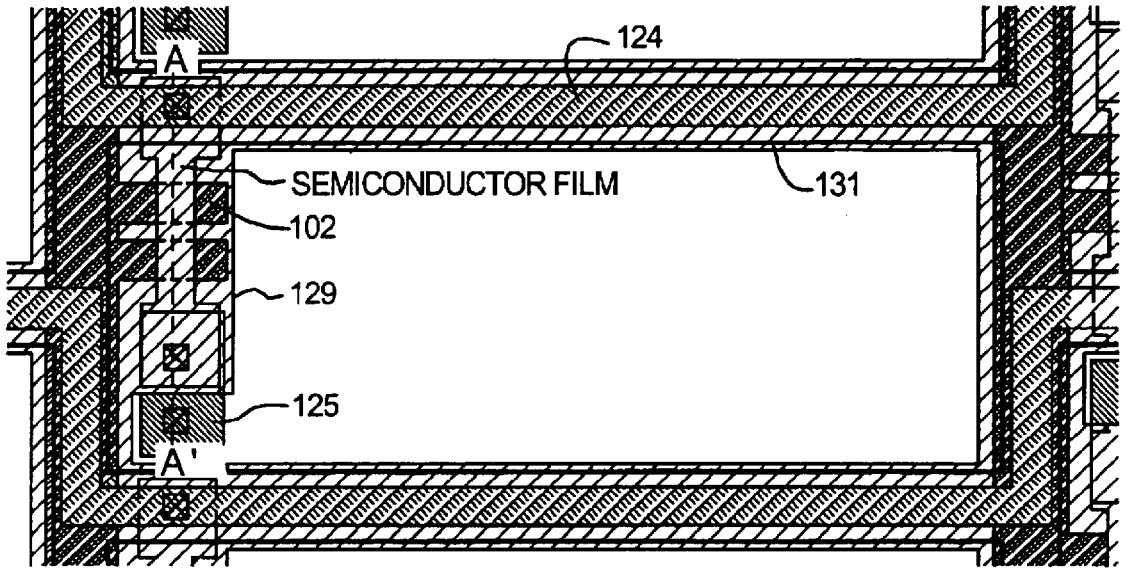
FIGS. 5A and 5B are top views showing an example of the structure of the present invention (Embodiment 1)
Figure 5B:
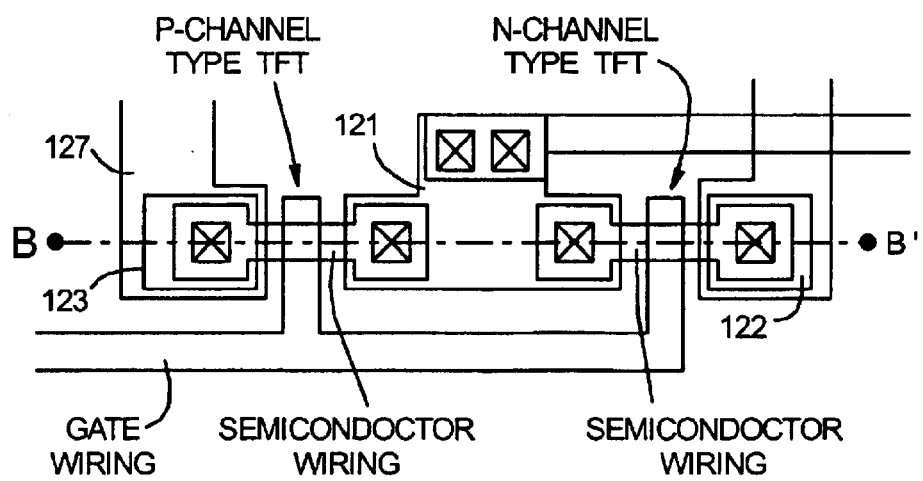

A description is given on an example of the structure of a semiconductor device provided with a semiconductor circuit comprising a semiconductor element (TFT) which is made by utilizing the above method of this embodiment, with reference to FIG. 4 and FIGS. 5A and 5B. The semiconductor device according to the present invention is provided with a peripheral driver circuit portion and a pixel portion which are over the same substrate. For the purpose of simplifying illustration, the drawings related to this embodiment show that the CMOS circuit, which is a part of the peripheral driver circuit portion, and the pixel TFT (n-channel TFT), which is a part of the pixel portion, are formed over the same substrate.

FIGS. 5A and 5B are views corresponding to the top view of FIG. 4. The portion cut along the dotted line A–A' in FIGS. 5A and 5B corresponds to the sectional structure of the pixel circuit in FIG. 4, and the portion cut along the dotted line B–B' in FIGS. 5A and 5B corresponds to the sectional structure of the CMOS circuit in FIG. 4. Reference symbols used in FIG. 4 and FIGS. 5A and 5B are the same as in FIGS. 1A to 3C.

In FIG. 4, each TFT (thin film transistor) is formed over the base film 101 disposed on the substrate 100. In the N-channel TFT of the CMOS circuit, the gate wiring 102 is formed on the base film and the gate insulating film 104 is formed thereon. Formed on the gate insulating film as an active layer are heavily doped regions (p+regions) 118, 119 (a source region or a drain region) serving, a channel forming region 415, lightly doped regions (p-regions) 416, 417 placed between the heavily doped regions and the channel forming region. The active layer is protected by the protective film 114 made of a silicon oxide film. A contact hole is formed in the first interlayer insulating film 120 covering the protective film 114, the wirings 121, 123 are connected to the heavily doped regions 418, 419, the second interlayer insulating film 126 is further formed thereon, a leading wiring 127 is connected to the wiring 123, and the third interlayer insulating film 130 is formed to cover thereon.

On the other hand, the p-channel TFT has as an active layer the heavily doped regions (n+regions) 118, 119 (a source region or a drain region), the channel forming region 115 and the lightly doped regions (n-regions) 116, 117 formed between the heavily doped regions and the channel forming region. The wirings 121, 122 are formed in the heavily doped regions 118, 119, and a leading wiring 128 is further connected to the wiring 122. Except for the active layer, the n-channel TFT has substantially the same structure as that of the p-channel TFT described above.

The n-channel TFT formed in the pixel circuit has the same structure as the n-channel TFT of the CMOS circuit up through the formation of the first interlayer insulating film 120. Wirings 124,125 are connected with the heavily doped regions 118, 119, the second interlayer insulating film 126 and a black mask 129 are formed thereon, further formed thereon is the third interlayer insulating film 130, and a pixel electrode 131 made of a transparent conductive film such as ITO or $SnO_2$ is connected thereto. This electrode 131 and the black mask form an auxiliary capacitance.

Although a transmission type LCD is manufactured as an example in this embodiment, the invention is not particularly limited thereto. For instance, a reflection type LCD may be fabricated when a metal material having reflectivity is used for a material of the pixel electrode, and patterning of the pixel electrode is changed or several steps are appropriately added or deleted.

In this embodiment, the gate wiring of the pixel TFT in the pixel circuit takes the double gate structure. Alternatively, the gate wiring may take the multi gate structure such as the triple gate structure in order to reduce the fluctuation in OFF current. Also it may take the single gate structure to improve opening ratio.

[Embodiment 2]

Embodiment 1 shows an example in which the back side exposure method using the reflecting plate is carried out twice, the size of the channel forming region is determined by the first resist pattern 109, and the second resist pattern 112 determines the size of the LDD region. In this embodiment, an example is shown where the first resist pattern 109 formed through the back side exposure method using the reflecting plate determines the size of the channel forming region, and the size of the LDD region is determined by a pattern formed through a known exposure method. Steps in this embodiment are the same as ones in Embodiment 1 up through the step of FIG. 2A, and hence explanation of those steps is omitted.

Figure 2A:
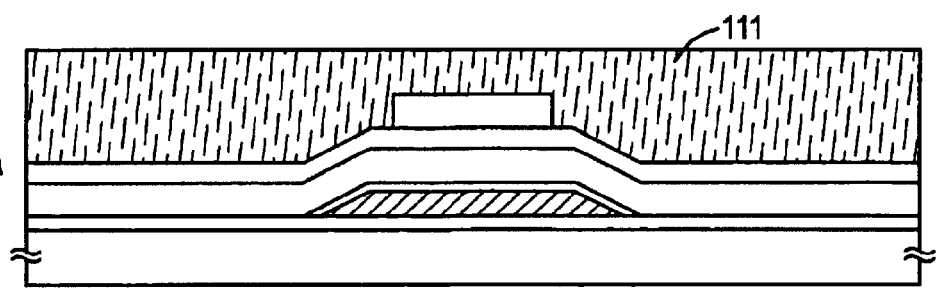
FIGS. 2A to 2D are views showing an example of the manufacturing process of the present invention (Embodiment 1)
Figure 2B:
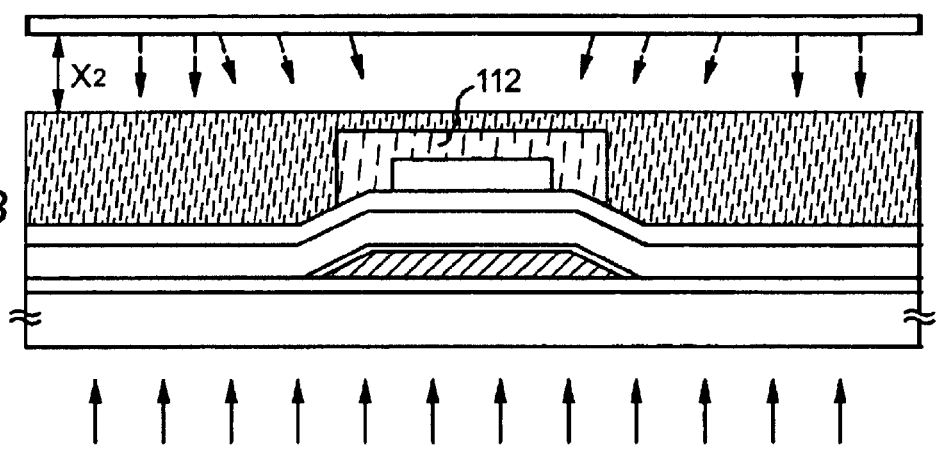
Figure 2C:
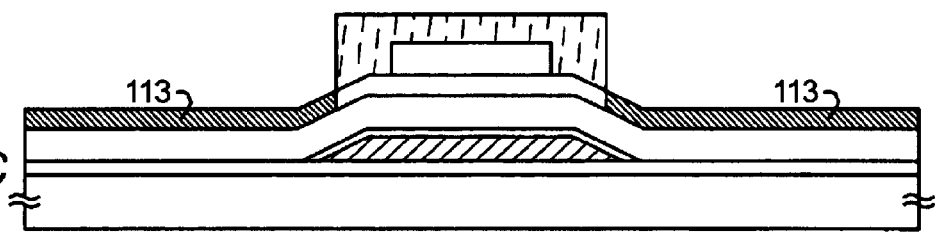
Figure 2D:
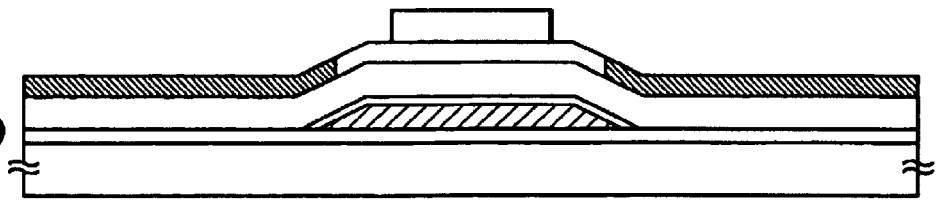

In this embodiment, after the state shown in FIG. 2A is obtained by following Embodiment 1, a known back side exposure is conducted to form a pattern made of the second photosensitive thin film which has the same shape as the gate wiring. This pattern made of the second photosensitive thin film determines the size of the LDD region. Subsequent steps follow Embodiment 1, completing the semiconductor device. The known back side exposure also being of self alignment manner, contributes to reduce the number of the photo masks used as in Embodiment 1.

In this embodiment, the first resist pattern 109 is formed through the back side exposure method using the reflecting plate, which is the present invention. Alternatively, the pattern made of the first photosensitive thin film may be formed through a known exposure method while the pattern made of the second photosensitive thin film is formed through the back side exposure method of the present invention. This embodiment is easy to combine with a known exposure method and how to combine them is not restricted.

[Embodiment 3]

This embodiment explains an example where a photosensitive thin film different from one in Embodiment 1 is used in FIG. 1B. Steps of this embodiment is the same as those in Embodiment 1 up through the step of FIG. 1A, and hence explanation of those steps is omitted.

Used in this embodiment is a positive resist material (a product of Tokyo Ohka Kogyo, THMR3300 LD) with higher resolution as compared with the photoresist material (a product of Tokyo Ohka Kogyo, TSMR8900) in Embodiment 1. This makes possible the very accurate exposure to form a pattern made of a photosensitive thin film. To enhance the accuracy of this pattern made of a photosensitive thin film allows to form precisely the shape of the channel forming region, thereby reducing the fluctuation in electric characteristics between TFTs.

Subsequent steps follow the steps in Embodiment 1 to complete the semiconductor device shown in FIG. 4.

This embodiment is easy to combine with Embodiments 1, 2, and how to combine them is not restricted.

[Embodiment 4]

In Embodiment 1, two kinds of doped regions, other than the channel forming region, which contain the same dopant with a different concentration are formed. Described in this embodiment is an example where at least three or more kinds of doped regions that contain the same dopant with a different concentration are formed other than the channel forming region. Steps in this embodiment are the same as ones in Embodiment 1 up through the step of FIG. 3B, and hence explanation of those steps is omitted.

In this embodiment, after the state shown in FIG. 3B is obtained by following Embodiment 1, a pattern made of a third photosensitive thin film is further formed through the back side exposure method of the present invention or a known method, doping is conducted to form, other than the channel forming region, at least three kinds of doped regions which contain the same dopant in a different concentration. However, the pattern made of the third photosensitive thin film has a shape larger than the first resist pattern and smaller than the second resist pattern. Subsequent steps follow Embodiment 1, completing the semiconductor device.

Incidentally, it is desirable to provide multi stages in dopant concentration so that the concentration becomes higher toward the source region (or drain region) from the channel forming region. This stepwise concentration shift magnifies the effect of easing the electric field, thereby increasing the hot carrier resistance. The semiconductor device manufactured by utilizing this embodiment has the TFT of excellent reliability, greatly improving the reliability of the semiconductor device as a whole.

This embodiment is easy to combine with Embodiments 1 to 3, and how to combine them is not restricted.

[Embodiment 5]

This embodiment shows below an example in which a first mask for forming a channel protecting film is patterned with the use of the back side exposure method of the present invention, and a second mask used upon formation of a source region and a drain region is formed by a normal exposure method (including the use of a photo mask).

In a bottom gate TFT in particular, degradation of ON current value (drain current flowing at the time of ON operation of a TFT) caused by hot carriers may be prevented when the boundary between an LDD region and a channel forming region is located at a position above a gate wiring, and at the same time, apart from the end of the gate wiring by a certain distance (for instance, a position about 1 μm away when the TFT size is L/W=8/8). Therefore, to form the first mask by the use of the back side exposure device of the present invention is appropriate.

The leak current of the TFT can be reduced when the boundary between the LDD region and the source region (or, drain region) is located on a region except for the region above the gate wiring and at a position apart from the end of the gate wiring by a certain distance (for instance, a position about 1 μm away when the TFT size is L/W=8/8). Therefore, to form the second mask by a known method of exposure from the back side using the photo mask is appropriate.

This embodiment is described with reference to FIGS. 7A to 10. Here, detailed description will be given, following down the steps, on a method of manufacturing simultaneously a pixel TFT of a display region and a TFT of a driver circuit that is arranged in the periphery of the display region.

In FIG. 7A, a substrate 701 may be made of a low alkaline substrate or a quartz substrate. An insulating film (not shown) such as a silicon oxide film, a silicon nitride film or a silicon nitride oxide film may be formed on one surface of this substrate 701 where the TFT is to be formed. Gate electrodes 702 to 704 and a capacitance wiring 705 are made from an element selected from a group consisting of tantalum (Ta), titanium (Ti), tungsten (W), molybdenum (Mo) chromium (Cr) and aluminum (Al), or made from a material containing those as a main ingredient. After forming a coat film by a known film formation method such as sputtering or vacuum evaporation, the film is subjected to etching treatment so that the end face has a tapered shape, and is formed into a pattern. In this embodiment, a tantalum nitride (TaN) film with a thickness of 50 nm and a Ta film with a thickness of 250 nm are formed by sputtering and layered, a resist mask is formed into a predetermined shape, and thereafter, the laminate films are subjected to a plasma etching treatment using mixture gas of $CF_4$ and $O_2$ to be processed into a desired shape. For the purpose of simplification, that the gate electrode has two layers are not illustrated in the drawing here. The gate electrode may have a two layer structure of, for example, tungsten nitride (WN) and tungsten (W). Though not shown here, the gate wiring connecting to the gate electrode is simultaneously formed.

A gate insulating film 706 is made of a material containing silicon oxide and silicon nitride with a thickness of 10 to 200 nm, preferably 50 to 150 nm. The gate insulating film may be formed by, for example, layering a silicon nitride film 706a containing row materials of $SiH_4$, $NH_3$ and $N_2$ and having a thickness of 50 nm and a silicon nitride oxide film 706b containing row materials of $SiH_4$ and $N_2O$ and having a thickness of 75 nm, which are formed by plasma CVD. Of course, to make the gate insulating film a single layer of a silicon nitride film or a silicon oxide film causes no trouble. The plasma hydrogen treatment prior to the film formation of the gate insulating film is appropriate method to obtain a clean surface.

Next, a crystalline semiconductor film to be an active layer of the TFT is formed. Silicon is used for a material of the crystalline semiconductor film. First, an amorphous silicon film with a thickness of 20 to 150 nm is formed by a known film formation method such as plasma CVD or sputtering, so that the film comes into close contact with the gate insulating film 706. Though conditions on formation of the amorphous silicon film are not limited, it is desirable to reduce down to $5\times10^{18}$ $cm^{-3}$ or less an impurity element such as oxygen or nitrogen contained in the film. The gate insulating film and the amorphous silicon film may be formed through the same method, making it possible to sequentially form the both films. There is no exposure to the atmosphere, not even once, after the formation of the gate insulating film. The surface thus can be prevented from contamination, and fluctuation in characteristics of the TFTs to be fabricated and variation in threshold voltage can be reduced. Then using a known crystallization technique, a crystalline silicon film 707 is formed. The crystalline silicon film 707 may be formed by, for example, laser annealing, thermal annealing (solid phase growth method), or the crystallization method with the use of catalytic element following the technology disclosed in Japanese Patent Application Laid-open No. Hei 7-130652.

A region in the crystalline silicon film 707, where an n-channel TFT is to be formed, may be doped with boron (B) at a concentration of about $1\times10^{16}$ to $5\times10^{17}$ atoms/$cm^3$, with the intention of controlling threshold voltage. Boron may be added through ion doping, or may be added at the same time as the amorphous silicon film is formed. (FIG. 7A).

Next, in order to form a lightly doped region to be the LDD region of the n-channel TFT, a mask for adding an impurity element for imparting n-type is formed. Firstly, a mask insulating film 708 is formed on the surface of the crystalline silicon film 707 using a silicon oxide film or a silicon nitride film with a thickness of 100 to 200 nm, typically 120 nm. After forming a photoresist film on the entire surface of this mask insulating film, the photoresist film is exposed by the back side exposure method of the present invention while gate electrodes 702 to 704 are used as masks. In this embodiment, exposure light quantity is 10 mW and the distance X between the reflecting plate 700 and the surface of the photoresist film is 500 μM. The distance X is set to 500 μm because it is the optimal value when the exposure light quantity is 10 mW. Used here is the exposure device (shown in FIG. 6) of the present invention with which the distance X may be freely adjusted within a range of from 0.1 μm to 1000 μm. The photoresist developed and exposed after the back side exposure step is removed to form resist masks 709 to 712 on the gate electrode and, at the same time, within the gate electrode area. (FIG. 7B)

The resist masks 709 to 712 obtained by the back side exposure device of the present invention are used as masks to dope through the mask insulating film 708 the crystalline silicon film lying below there with an impurity element for imparting n-type with the use of ion doping (or, ion implanting). In the technical field of semiconductors, group XV elements in the periodic table such as phosphorus (P), arsenic (As), antimony (Sb) are used as impurity elements for imparting n-type, and phosphorus is employed here. The phosphorus (P) concentration of formed lightly doped regions 713 to 718 is desirably within a range of from $1\times10^{17}$ $cm^{-3}$ to $5\times10^{18}$ $cm^{-3}$, here $5\times10^{17}$ $cm^{-3}$. In this specification, the concentration of the impurity element for imparting n-type in the doped regions 713 to 718 is expressed as ($n^-$). (FIG. 7C)

Figure 8A:
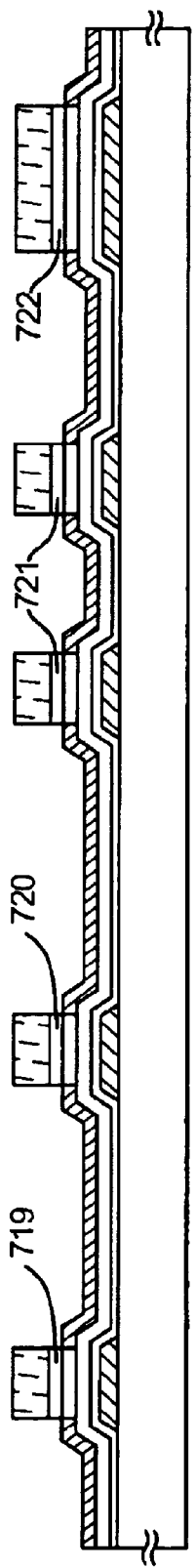
FIGS. 8A to 8C are views showing an example of the manufacturing process of the present invention (Embodiment 5)

Next, the mask insulating film 708 is etched and removed using the resist masks to form channel protective films 719 to 722. In order to etch the mask insulating film 708 with good selectability with respect to the crystalline silicon film 707 serving as the base, adopted here is wet etching including the use of a fluoric-acid-based solution. The etching may of course be made by dry etching, for instance, the insulating film 708 may be etched with $CHF_3$ gas. Over etching, which results in the channel protective regions 719 to 722 formed on the side inward to the end faces of the resist masks 709 to 712, is also an option in this step. (FIG. 8A).

Figure 8B:
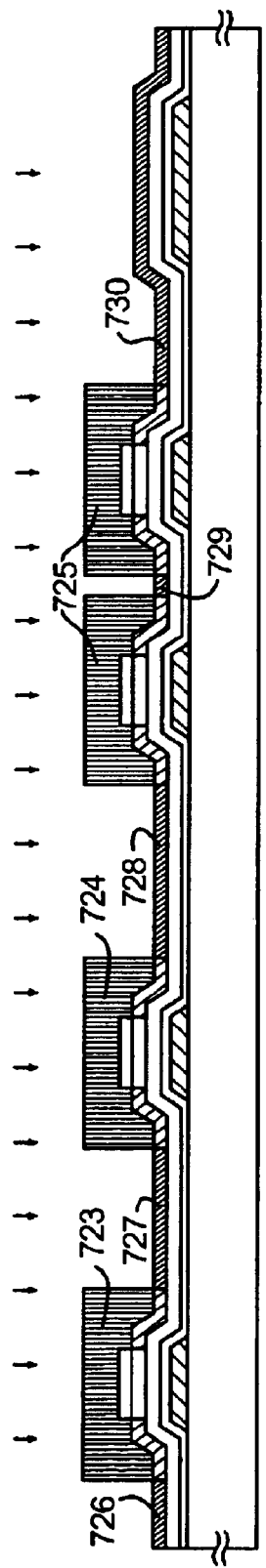

Then in the n-channel TFT, the step of forming heavily doped regions to serve as the source region or the drain region is performed. Masks 723 to 725 made of resist are formed by a normal exposure method here. Using the resist masks, the channel protective film 722 over a capacitance wiring 705 is etched and removed. Subsequently, the crystalline silicon film 707 is doped with an impurity element for imparting n-type through ion doping (or, ion implanting) to form heavily doped regions 726 to 730. The heavily doped regions 726 to 730 may contain the impurity element at a concentration of $1 \times 10^{20}$ cm$^{-3}$ to $1 \times 10^{21}$ cm$^{-3}$, here $5 \times 10^{20}$ cm$^{-3}$. In this specification, that concentration is expressed as (n+). (FIG. 8B).

Figure 8C:
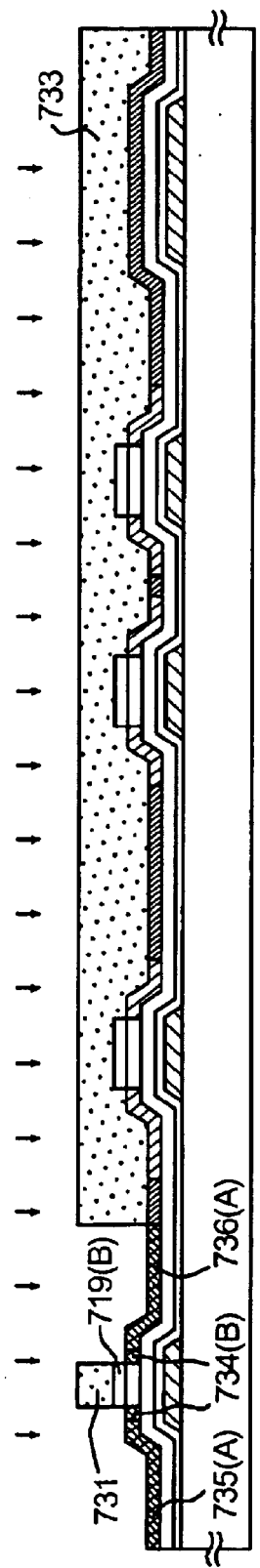

Next, the step of adding an impurity element for imparting p-type is conducted to form heavily doped regions to be the source region and the drain region of the channel TFT in the driver circuit. In the technical field of semiconductors, group XIII elements in the periodic table such as boron (B), aluminum (Al), gallium (G) are used as impurity elements for imparting p-type, and boron (B) is employed here. In FIG. 8C, a mask 731 is formed so as to be positioned within an area on the channel protective film 719, and all the regions that form the n-channel TFT are covered with a resist mask 733. Through wet etching using a fluoric-acid-based solution, etching treatment is applied so that ends of the channel protective film 719 substantially coincide with ends of the mask 731, thereby forming a channel protection insulating film 719$b$ with a new shape. Then, heavily doped regions 734 to 736 are formed by ion doping (or, ion implanting) using dibolane (B$_2$H$_6$). The doped regions 734 to 736 are formed by adding the impurity element into the surface of the crystalline silicon film. The boron concentration in the regions ranges from $1.5 \times 10^{20}$ cm$^{-3}$ to $3 \times 10^{21}$ cm$^{-3}$ and is set here to $2 \times 10^{21}$ cm$^{-3}$. In this specification, (p$^+$) is used to express the concentration of an impurity element for imparting p-type in the doped regions 734 to 736 formed here. In this way, the ends of the heavily doped regions of the p-channel TFT, the ends being in contact with the channel forming region, are arranged on the side nearer to the channel forming region than the ends of the lightly doped regions formed at the previous step, improving the junction state in this portion.

As shown in FIGS. 7B to 8A, the doped regions 735, 736, having been doped with phosphorus (P) at the previous step, contain a region where boron (B) and phosphorus (P) are mixed. However, p-type conductivity in the regions can be secured by setting the concentration of boron added at this step to a value 1.5 to 3 times the concentration of phosphorus, exercising no influence on characteristic of the TFT. In this specification, this region is called a region (A). The doped region 734 located on the channel forming region side of the region (A) is a region containing boron (B) only, and is called a region (B) in this specification. (FIG. 8C).

Figure 9A:
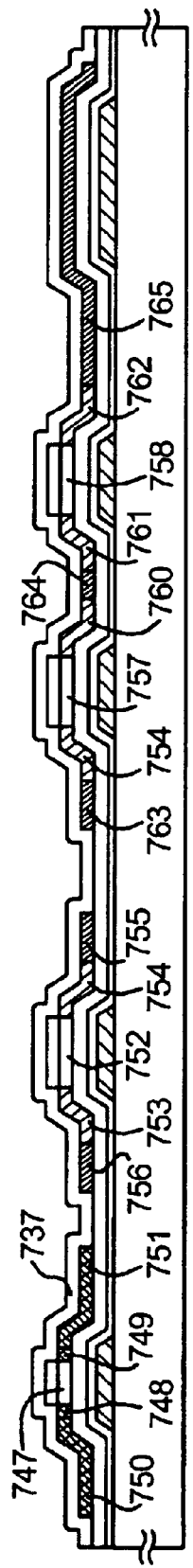
FIGS. 9A and 9B are views showing an example of the manufacturing process of the present invention (Embodiment 5)

After the crystalline silicon film is selectively doped with each impurity element, the crystalline silicon film is patterned into island-like shapes by etching treatment to form a protection insulating film 737, which later becomes a part of a first interlayer insulating film as shown in FIG. 9A. The protection insulating film 737 may be a silicon nitride film, a silicon oxide film or a silicon nitride oxide film, or may be a laminate film using the films in combination. The film thickness may be 100 to 400 nm.

After that, the heat treatment step is performed to activate the impurity elements for imparting n-type or p-type which are added in respective concentrations. This step may be carried out by furnace annealing, laser annealing, rapid thermal annealing (RTA) or the like. Further heat treatment is performed in an atmosphere containing 3 to 100% hydrogen at 300 to 450° C. for 1 to 12 hours, to hydrogenate the active layer. This step is a step to terminate the dangling bond in the active layer by the hydrogen thermally excited. Other usable hydrogenation means includes plasma hydrogenation (using hydrogen excited by plasma). Numerals 747, 752, 757, and 758 denote channel forming regions of thin film transistors, respectively. Regions denoted by numerals 748 to 751 are p+regions, regions denoted by numerals 755, 756, 763, 764, and 765 are n+regions, and regions denoted by numerals 753, 754, 759, 760, 761, and 762 are n-regions, respectively.

In the case that the crystalline silicon film 707 to be the active layer is formed from an amorphous silicon film through a crystallization method using a catalytic element, remained catalytic element in the crystalline silicon film 707 is approximately $1 \times 10^{17}$ cm$^{-3}$ to $5 \times 10^{19}$ cm$^{-3}$. Completing and operating the TFT in such a state does not give rise to any problem, of course. However, it is preferable to remove the remained catalytic element from at least the channel forming region. One of methods for removing the catalytic element is that utilizes gettering effect. The phosphorus (P) concentration required for gettering is about the same as the doped region (n$^+$) formed in FIG. 8B. Through the heat treatment at the activation step conducted here, the catalytic element is gettered from the channel forming regions of the n-channel TFT and the p-channel TFT to the heavily doped regions doped with phosphorus (P). As a result, the catalytic element concentration in the channel forming region may be $5 \times 10^{17}$ cm$^{-3}$ or less, and the segregation of the catalytic element takes place in the above doped regions in $1 \times 10^{18}$ to $5 \times 10^{20}$ cm$^{-3}$. (FIG. 9A).

After the activation step, an interlayer insulating film 738 having a thickness of 500 to 1500 nm is formed on the protection insulating film 737. A laminate film consisting of the protection insulating film 737 and the interlayer insulating film 738 is regarded as a first interlayer insulating film. After that, contact holes reaching the source regions or drain regions of the respective TFTs are formed to form source wirings 739 to 741 and drain wirings 742, and 743. Though not shown, each of these electrodes are made of a laminate film having a three layer structure in which a Ti film with a thickness of 100 nm, an aluminum film containing Ti and having a thickness of 300 nm and another Ti film with a thickness of 150 nm are formed in succession by sputtering.

The protection insulating film 737 and the interlayer insulating film 738 may be made of a silicon nitride film, a silicon oxide film, a silicon nitride oxide film, etc. Whichever material they use, the internal stress of the films can be regarded as compression stress.

Next, a passivation film 744 is formed in a thickness of 50 to 500 nm (typically, 100 to 300 nm) using a silicon nitride film, a silicon oxide film or a silicon nitride oxide film. Thereafter, hydrogenation treatment is performed in this state to obtain a preferable result regarding to improvement of TFT characteristic. An example of the hydrogenation treatment is a heat treatment in an atmosphere containing 3 to 100% hydrogen at 300 to 450° C. for 1 to 12 hours. Plasma hydrogenation may also provide a similar effect. At this point, an opening may be formed in the passivation film 744 at a position where a contact hole for connecting a pixel electrode and the drain wiring later is to be formed.

A second interlayer insulating film 745 made of an organic resin film is then formed in a thickness of about 1 μm. Applicable organic resin materials include polyimide, acryl, polyamide, polyimideamide and BCB (benzocyclobutene). Here, the film is formed by using polyimide of the type to be thermally polymerized after applied to the substrate, and is burned at 300° C. Contact holes reaching the drain wiring 743 are formed in the second interlayer insulating film 745 and the passivation film 744, forming a pixel electrode 746. The pixel electrode 746 is made of a transparent conductive film when a transmission type liquid crystal display device is intended, and of a metal film when a reflection type liquid crystal display device is to be fabricated. A transmission type liquid crystal display device is aimed here, and an indium tin oxide (ITO) film is formed in a thickness of 100 nm by sputtering.

Figure 9B:
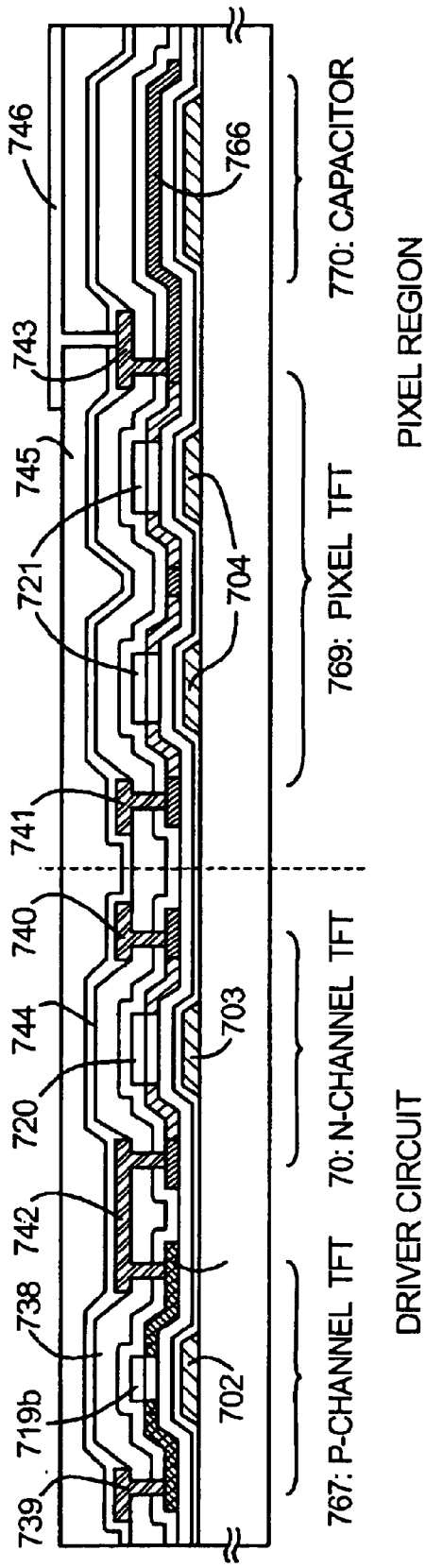

Through the steps above, the pixel TFT in the display region and the TFT of the driver circuit arranged at the periphery of the display region are formed on the same substrate. In the driver circuit, an n-channel TFT 768 and a p-channel TFT 767 are formed, making it possible to form a logic circuit based on the CMOS circuit. A pixel TFT 769 is an n-channel TFT, and is connected to a capacitor 770 that is comprised of the capacitance wiring 705, a semiconductor layer 766 and an insulating-film formed therebetween. (FIG. 9B)

This embodiment is easy to combine with Embodiments 1 through 4, and how to combine them is not restricted.

[Embodiment 6]

Figure 10:
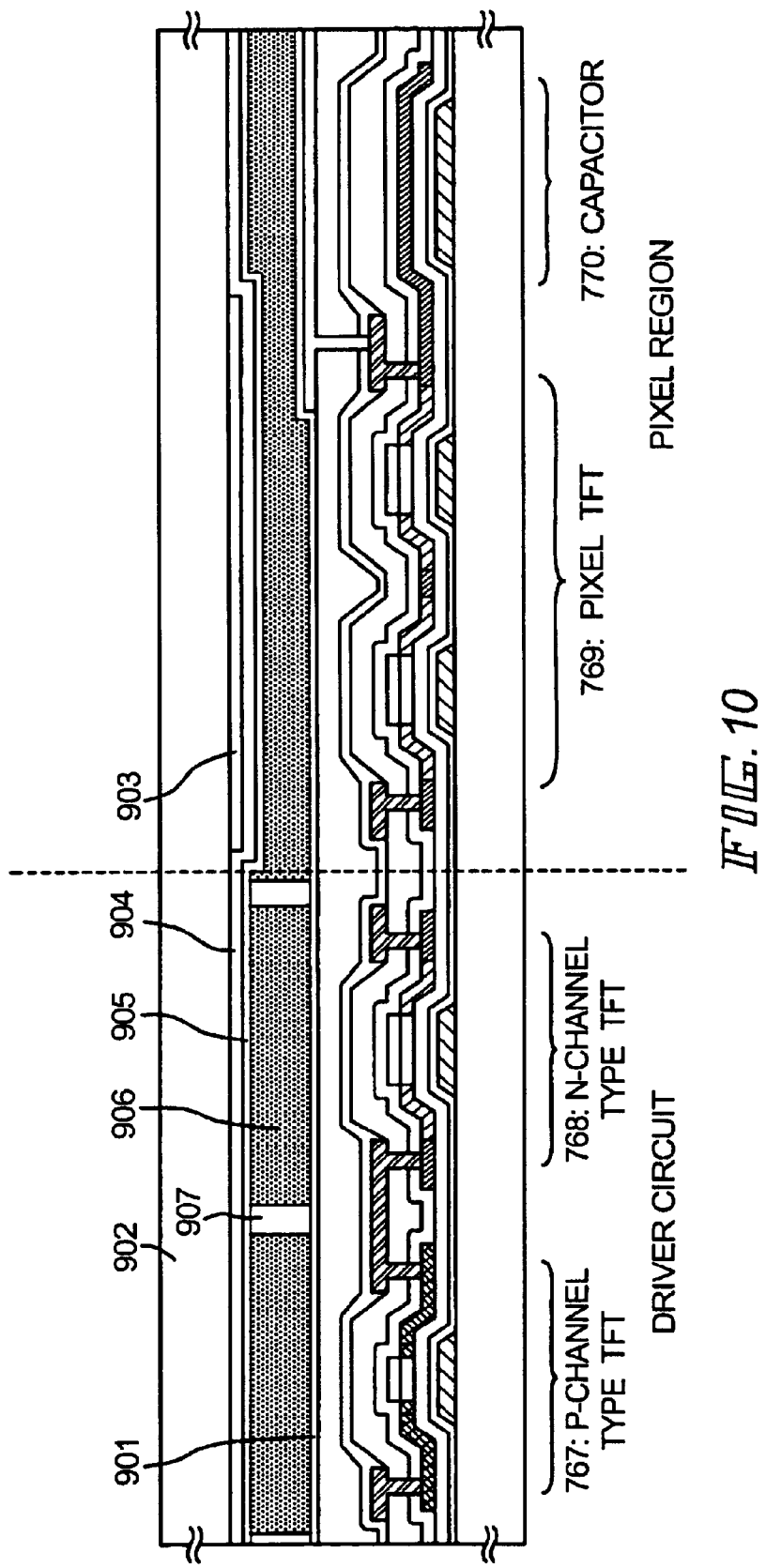
FIG. 10 is a view showing a sectional structure of a liquid crystal display device (Embodiment 6)

This embodiment describes a process of manufacturing an active matrix liquid crystal display device using a substrate on which a pixel TFT and a driver circuit are formed. As shown in FIG. 10, an orientated film 901 is formed on the substrate in the state of FIG. 9B shown in Embodiment 5. Usually, polyimide resin is often used for an orientated film of a liquid crystal display element. On an opposite side substrate 902, a light-shielding film 903, a transparent conductive film 904 and an orientated film 905 are formed. After forming the orientated film, rubbing treatment is performed so that liquid molecules are oriented with a certain pre-tilt angle. The substrate on which the pixel TFT and the driver circuit are formed is bonded with the opposite substrate by a known cell assembling process through a sealant (not shown) or a columnar spacer 907. A liquid crystal material 906 is then injected between two substrates to completely seal with an end sealing material (not shown). Known liquid crystal materials may be used. Thus completed is the active matrix liquid crystal display device shown in FIG. 10.

This embodiment is easy to combine with Embodiments 1 through 5, and how to combine them is not restricted.

[Embodiment 7]

Figure 11:
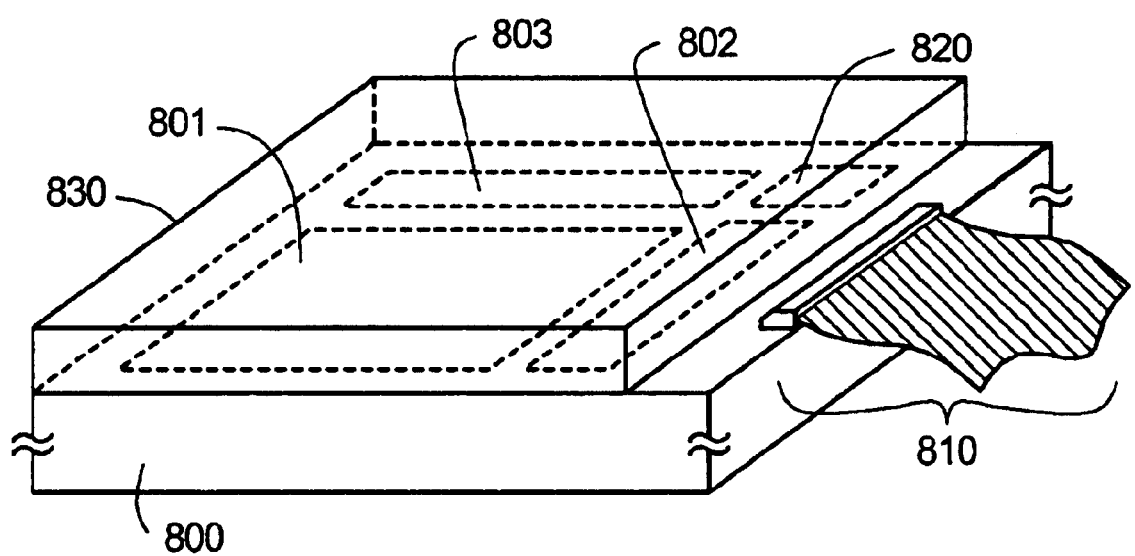
FIG. 11 shows an active matrix type display device (Embodiment 7)

This embodiment shows, referring to FIG. 11, an example of a liquid crystal display device manufactured by the present invention.

In FIG. 11, reference symbol 800 denotes a substrate having an insulating surface (a plastic substrate on which a silicon oxide film is formed); 801, a display region; 802, a scanning line driver circuit; 803, a signal line driver circuit; 830, an opposite substrate; 810, a FPC (flexible printed circuit); and 820, a logic circuit. Usable as the logic circuit 820 is a circuit that conducts a process IC has conventionally substituted, such as a D/A converter, a γ correction circuit, a signal dividing circuit, etc. An IC chip may be disposed on the substrate, of course, to conduct signal processing in the IC chip.

Though description is made taking an example of a liquid crystal display device in this embodiment, it is needless to say that the present invention is also applicable to an EL (electroluminescence) display device and an EC (electrochromics) display device as long as it is an active matrix type display device.

Whether it is a transmission type or a reflection type does not matter when a liquid crystal display device is manufactured with the use of the present invention. The person who carries out the invention may freely decide which type to choose. Thus, the present invention may be applied to every active matrix type electrooptical device (semiconductor device).

Upon fabrication of the semiconductor device shown in this embodiment, any construction of Embodiments 1 through 6 may be employed and to use the embodiments in free combination is possible.

[Embodiment 8]

The present invention is applicable to conventional IC techniques in general. That is, it may be applied to all the semiconductor circuits that are distributed in the market at present. For instance, it may be applied to microprocessors such as an RISC processor or an ASIC processor which is integrated on one chip, to a signal processing circuit a typical example of which is a driver circuit for liquid crystal (such as a D/A converter, a γ correction circuit and a signal dividing circuit), or to a high frequency circuit for a portable device (such as a cellular phone, a PHS: personal handy phone system, and a mobile computer).

A semiconductor circuit such as a microprocessor is provided in various electronic equipments to function as a central circuit. Enumerated as a typical electronic equipment are a personal computer, a portable type information terminal device and any other household appliances. A computer for controlling a vehicle (automobiles or trains) may also be given as an example. The present invention is applicable also to such a semiconductor device.

When manufacturing the semiconductor device shown in this embodiment, any construction of Embodiments 1 through 4 may be employed and to use the embodiments in free combination is possible.

[Embodiment 9]

A TFT formed through carrying out the present invention may be applied to various electrooptical devices. Namely, the present invention may be embodied in all the electronic equipments that incorporate those electrooptical devices as display devices.

As such an electronic equipment, a video camera, a digital camera, a head mount display (goggle type display), an wearable display, a navigation system for vehicles, a personal computer, and a portable information terminal (a mobile computer, a cellular phone, or an electronic book) may be enumerated. Examples of those are shown in FIGS. 12A to 12F.

Figure 12A:
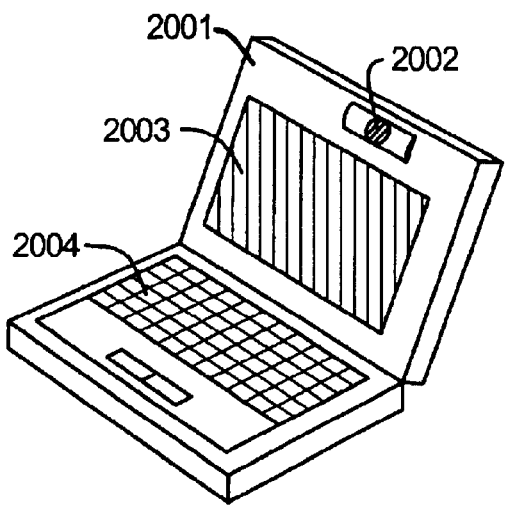
FIGS. 12A to 12F are views showing examples of an electronic equipment (Embodiment 9)

FIG. 12A shows a personal computer comprising a main body 2001, an image inputting unit 2002, a display device 2003, and a keyboard 2004. The present invention is applicable to the image inputting unit 2002, the display device 2003, and other signal control circuits.

Figure 12B:
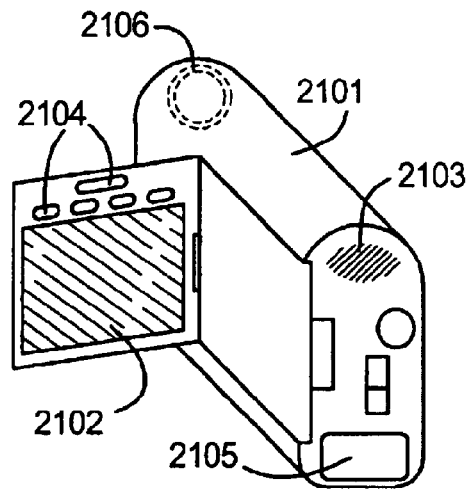

FIG. 12B shows a video camera comprising a main body 2101, a display device 2102, a voice input unit 2103, operation switches 2104, a battery 2105, and an image receiving unit 2106. The present invention is applicable to the display device 2102, the voice input unit 2103, and other signal control circuits.

Figure 12C:
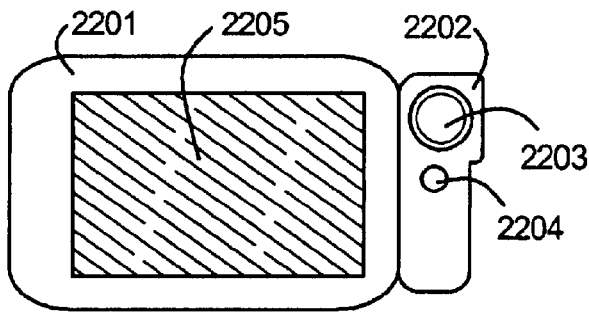

FIG. 12C shows a mobile computer comprising a main body 2201, a camera unit 2202, an image receiving unit 2203, an operation switch 2204, and a display device 2205. The present invention is applicable to the display device 2205 and other signal control circuits.

Figure 12D:
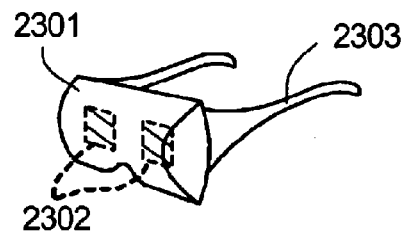

FIG. 12D shows a goggle type display comprising a main body 2301, display devices 2302 and arm portions 2303. The present invention is applicable to the display devices 2302 and other signal control circuits.

Figure 12E:
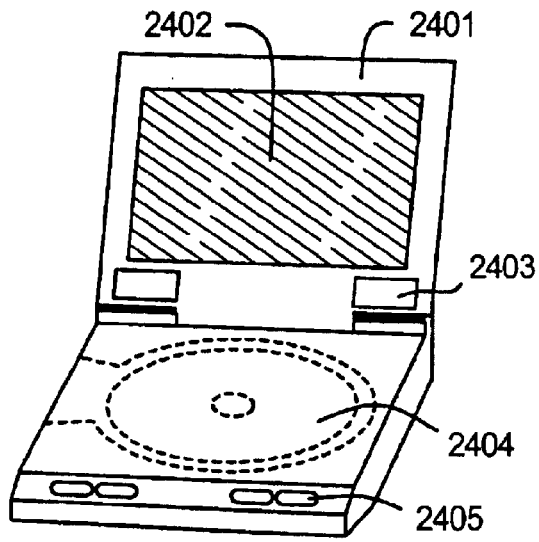

FIG. 12E shows a player that employs a recording medium in which programs are recorded (hereinafter referred to as recording medium), and comprises a main body 2401, a display device 2402, a speaker unit 2403, a recording medium 2404, and an operation switch 2405. Incidentally, this player uses as the recording medium a DVD (digital versatile disc), a CD and the like to serve as a tool for enjoying music or movies, for playing video games and for connecting to the Internet. The present invention is applicable to the display device 2402 and other signal control circuits.

Figure 12F:
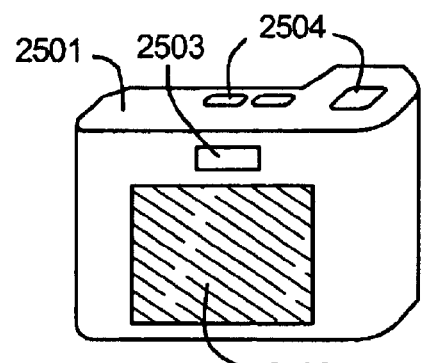

FIG. 12F shows a digital camera comprising a main body 2501, a display device 2502, an eye piece section 2503, operation switches 2504, and an image receiving unit (not shown). The present invention is applicable to the display device 2502 and other signal control circuits.

As described above, the present invention has so wide application range that it is applicable to electronic equipments in any field. In addition, the electronic equipment of this embodiment may be realized with any construction obtained by combining Embodiments 1 through 8.

[Embodiment 10]

A TFT formed through carrying out the present invention may be applied to various electrooptical devices. Namely, the present invention may be embodied in all the electronic equipments that incorporate those electro optical devices as display media.

Enumerated as such an electronic equipment are projectors (rear type projector and front type projector). Examples of those are shown in FIGS. 13A to 13D.

Figure 13A:
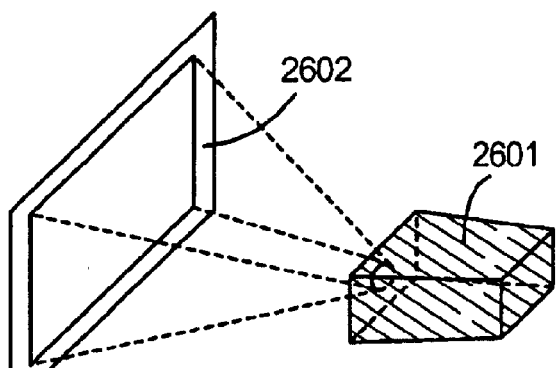
FIGS. 13A to 13D are views showing examples of the electronic equipment (Embodiment 10)

FIG. 13A shows a front type projector comprising a display device 2601 and a screen 2602. The present invention is applicable to the display device and other signal control circuits.

Figure 13B:
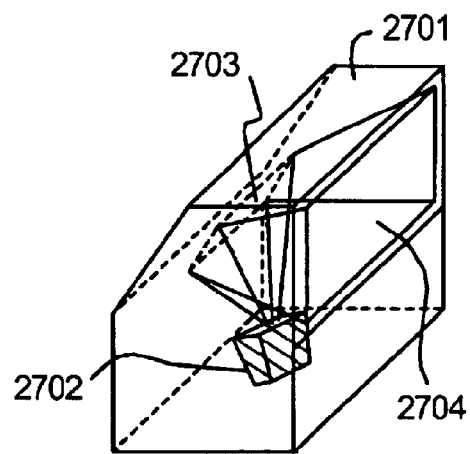

FIG. 13B shows a rear type projector comprising a main body 2701, a display device 2702, a mirror 2703, and a screen 2704. The present invention is applicable to the display device and other signal control circuits.

Figure 13C:
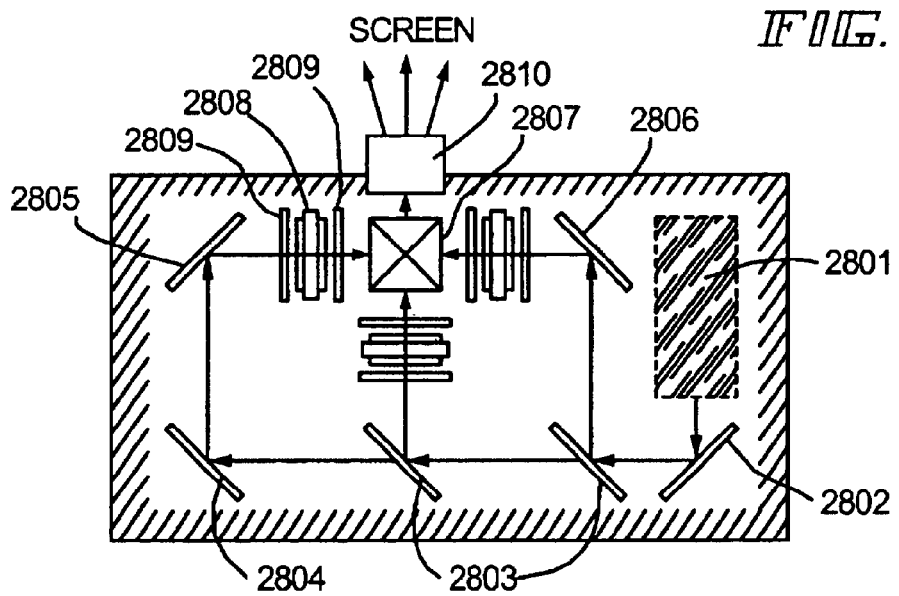

FIG. 13C is a diagram showing an example of the structure of the display devices 2601, 2702 in FIGS. 13A and 13B. The display device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 comprises an optical system including a projection lens. This embodiment shows an example of "three plate type", but not particularly limited thereto. For instance, the invention may be applied also to "single plate type". Further, in the light path indicated by an arrow in FIG. 13C, an optical system such as an optical lens, a film having a polarization function, a film for adjusting a phase difference and an IR film may be provided on discretion of a person who carries out the invention.

Figure 13D:
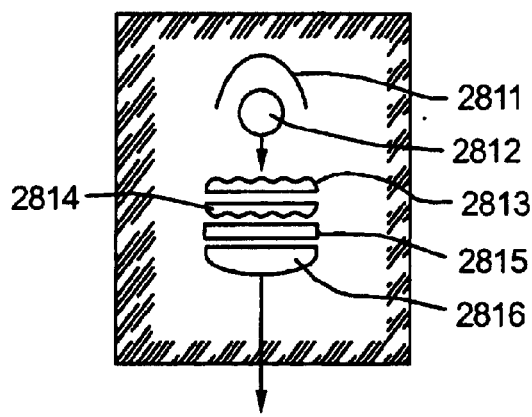
Figure 14A:
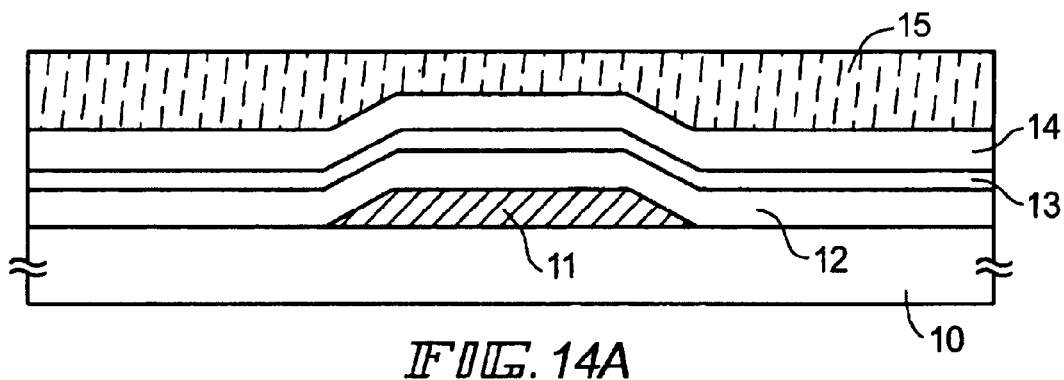
FIGS. 14A to 14C are views showing an example of a conventional manufacturing process.
Figure 14B:
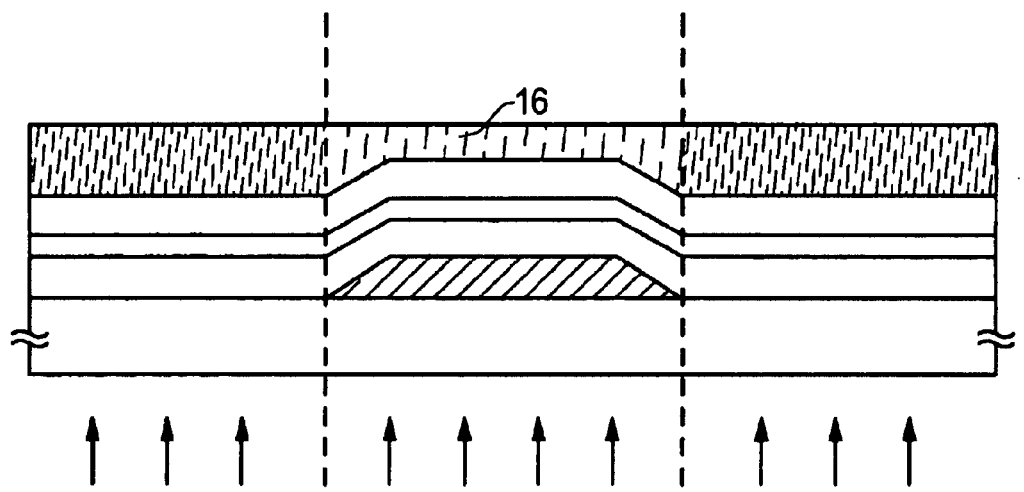
Figure 14C:
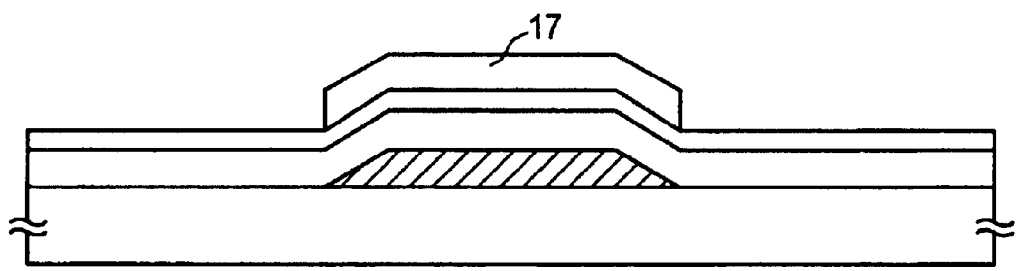

FIG. 13D is a diagram showing an example of the structure of the light source optical system 2801 in FIG. 13C. In this embodiment, the light source optical system 2801 comprises a reflector 2811, light sources 2812, lens arrays 2813, 2814, a polarization conversion element 2815, and a condenser lens 2816. The light source optical system shown in FIG. 13D is merely an example, and is not particularly limited. For instance, on discretion of a person who carries out the invention, the light source optical system may be provided with an optical system such as an optical lens, a film having a polarization function, a film for adjusting the phase difference and an IR film.

As described above, the present invention has so wide application range that it is applicable to electronic equipments in any field. In addition, the electronic equipment of this embodiment may be realized with any construction obtained by combining Embodiments 1 through 8.

[Embodiment 11]

This example demonstrates a process for producing an active matrix type EL (electroluminescence) display device according to the invention of the present application.

Figure 15A:
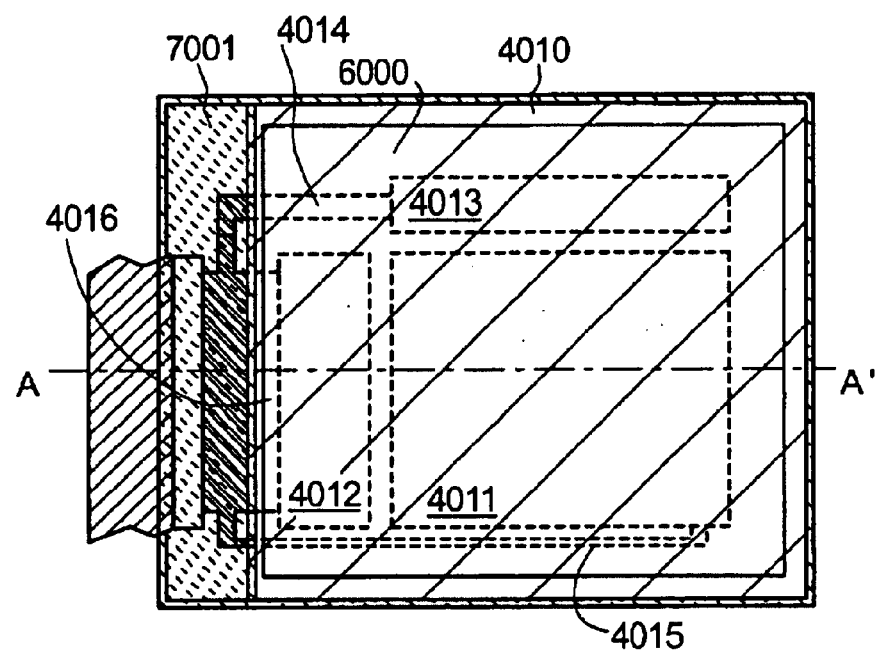
FIGS. 15A to 15B are views showing a structure of an active matrix type EL display panel (Embodiment 11)

FIG. 15A is a top view showing an EL display device, which was produced according to the invention of the present application.

In FIG. 15A, there are shown a substrate 4010, a pixel portion 4011, a source side driving circuit 4012, and a gate side driving circuit 4013, each driving circuit connecting to wirings 4014 to 4016 which reach FPC 4017 leading to external equipment.

The pixel portion, preferably together with the driving circuit, is enclosed by a covering material 6000, a sealing material (or housing material) 7000, and an end sealing material (or second sealing material) 7001.

Figure 15B:
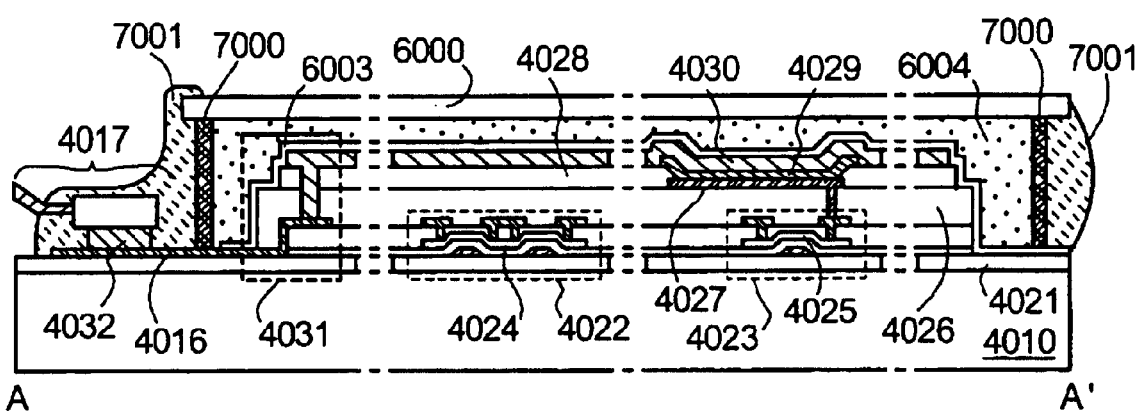

FIG. 15B is a sectional view showing the structure of the EL display device in this Example. There is shown a substrate 4010, a base film 4021, a TFT 4022 for the driving circuit, and a TFT 4023 for the pixel portion. (The TFT 4022 shown is a CMOS circuit consisting of an n-channel type TFT and a p-channel type TFT. The TFT 4023 shown is the one, which controls current to the EL element.)

Incidentally, the present invention is used in fabrication of the TFT 4022 for the driving circuit and the TFT 4023 for the pixel portion.

Upon completion of TFT 4022 (for the driving circuit) and TFT 4023 (for the pixel portion) according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel portion. When the pixel electrode comprises a transparent conductive film, it is desirable that p-channel TFTs are used as pixel TFT. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single layer structure or multi layer structure by freely combining known EL materials such as a hole injection layer, a hole transport layer, a light emitting layer, an electron transport layer, and an electron injection layer. Any known technology may be available for such structure. The EL material is either a low molecular material or a high molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 subsequently in a vacuum, or by forming the EL layer 4029 in an inert atmosphere and then forming the cathode 4030 in the same atmosphere without exposing to air. In this Example, the desired film was formed by using a film forming apparatus of multi chamber system (cluster tool system).

The multi layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 may be formed from MgAg electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end sealing material 7001, and the substrate 4010. As in the wiring 4016 explained above, other wirings 4014 and 4015 are also electrically connected to FPC 4017 under the sealing material 4018.

[Embodiment 12]

Figure 16A:
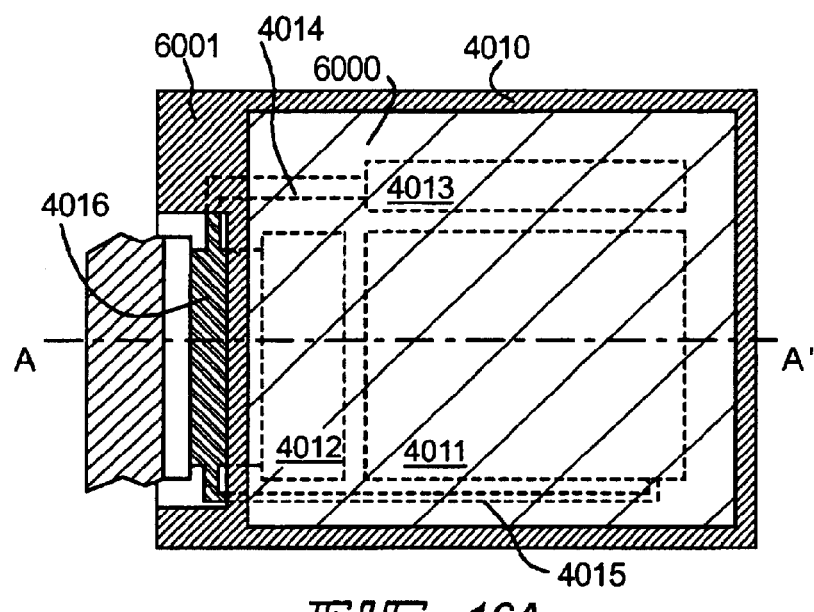
FIGS. 16A to 16B are views showing a structure of an active matrix type EL display panel (Embodiment 12)
Figure 16B:
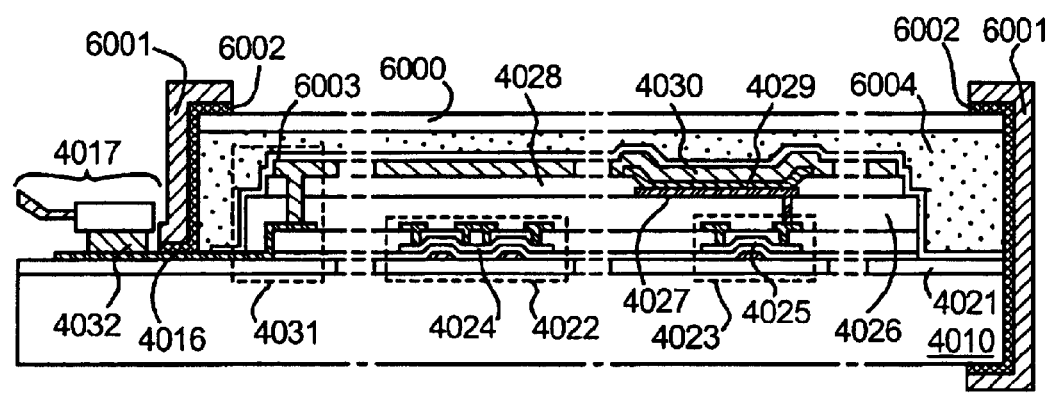

In this embodiment, another active matrix type EL display device having a different structure from the Embodiment 11 is explained, as shown in FIGS. 16A and 16B. The same reference numerals in FIGS. 16A and 16B as in FIGS. 15A and 15B indicate same constitutive elements, so an explanation is omitted.

FIG. 16A shows a top view of the EL module in this embodiment and FIG. 16B shows a sectional view of A–A' of FIG. 16A.

According to Embodiment 11, the passivation film 6003 is formed to cover a surface of the EL element.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 3404. Then, the flame material 6001 is attached to cover side portions (exposed faces) of the filling material 6004. The flame material 6001 is adhered by the sealing material (acts as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wirings 4014 and 4015 are also electrically connected to FPC 4017 under the sealing material 6002.

[Embodiment 13]

Figure 17:
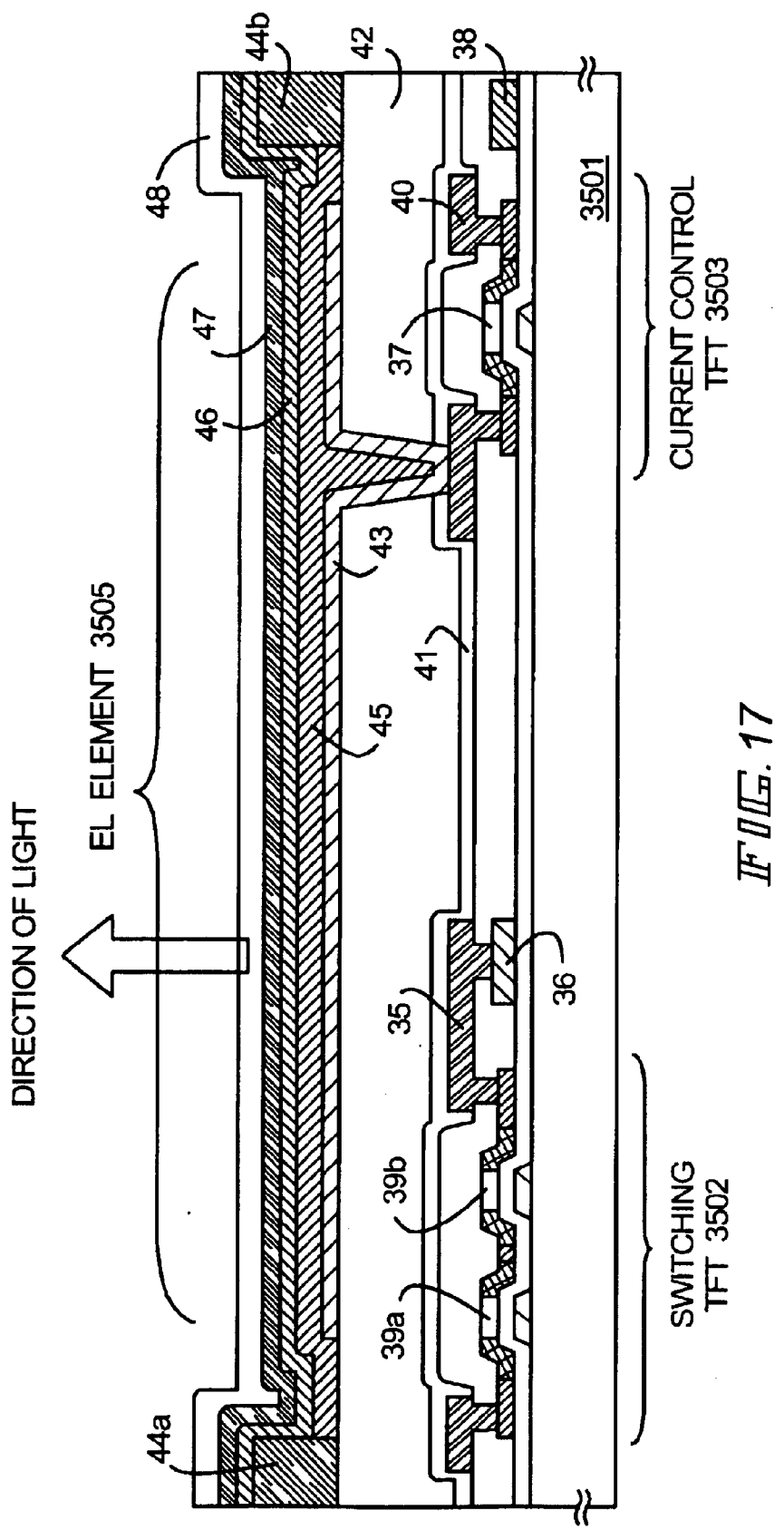
FIG. 17 is a view showing a cross section of a pixel portion in the an active matrix type EL display panel (Embodiment 13)
Figure 18A:
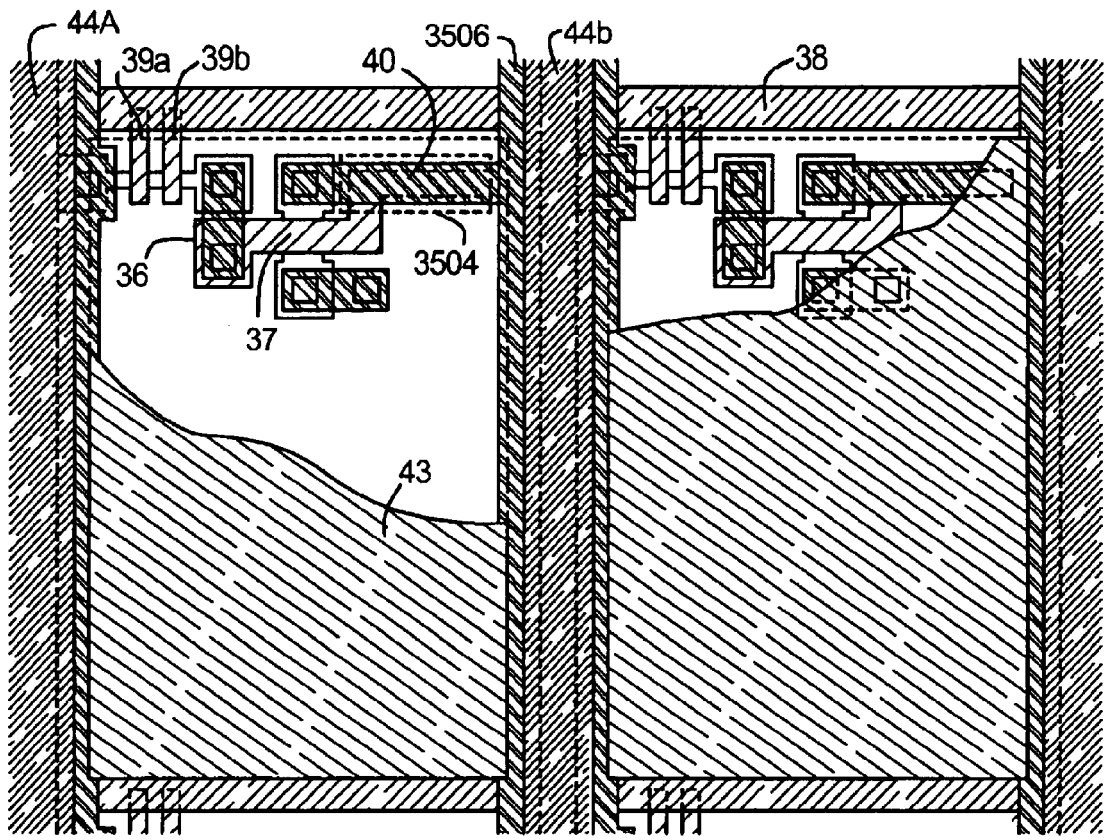
FIGS. 18A to 18B are views showing a structure of the pixel portion in an active matrix type EL display panel and a circuit structure for the pixel portion, respectively (Embodiment 13)
Figure 18B:
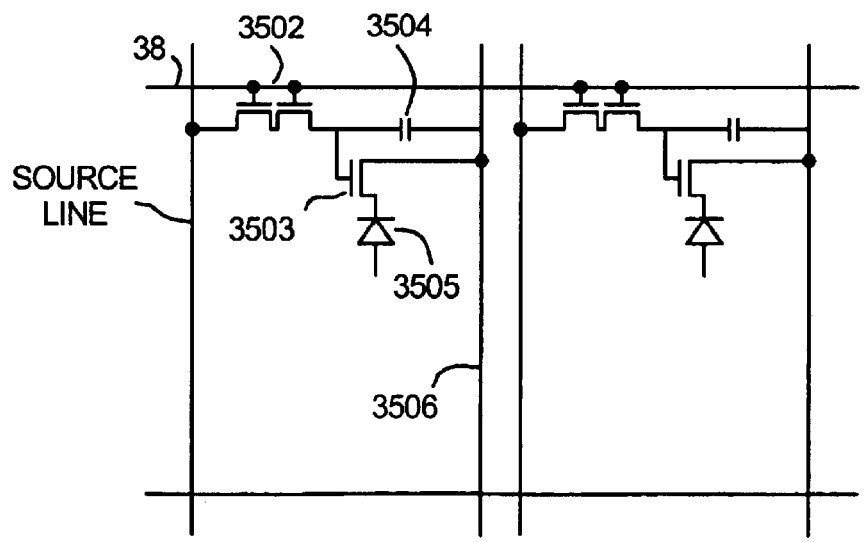

In the an active matrix type EL display device having a structure based on the Embodiment 11 or 12, the present invention can be used. In this embodiment, the structure of the pixel region in the panel is illustrated in more detail. FIG. 17 shows the cross section of the pixel region; FIG. 18A shows the top view thereof; and FIG. 18B shows the circuit structure for the pixel region. In FIG. 17, FIG. 18A and FIG. 18B, the same reference numerals are referred to for the same portions, as being common thereto.

In FIG. 17, the switching TFT 3502 formed on the substrate 3501 is NTFT fabricated using the invention (cf.

Embodiments 1 to 5). In this Embodiment, it has a double gate structure, but its structure and fabrication process do not so much differ from the structures and the fabrication processes illustrated hereinabove, and their description is omitted herein. However, the double gate structure of the switching TFT 3502 has substantially two TFTs as connected in series, and therefore has the advantage of reducing the off current to pass therethrough. In this Embodiment, the switching TFT 3502 has such a double gate structure, but is not limitative. It may have a single gate structure or a triple gate structure, or even any other multi gate structure having more than three gates. As the case may be, the switching TFT 3502 may be PTFT of the invention.

The current control TFT 3503 is NTFT of the invention. The drain wire 35 in the switching TFT 3502 is electrically connected with the gate electrode 37 of the current control TFT, via the wire 36 therebetween. The wire indicated by 38 is a gate wire for electrically connecting the gate electrodes 39a and 39b in the switching TFT 3502.

It is very important that the current control TFT 3503 has the structure fabricated by using the invention. The current control TFT is a unit for controlling the quantity of current that passes through the EL device. Therefore, a large quantity of current passes through it, and the unit, current control TFT has a high risk of thermal degradation and degradation with hot carriers. To this unit, therefore, the LDD structure of the invention is extremely favorable.

In this Embodiment, the current control TFT 3503 is illustrated to have a single gate structure, but it may have a multi gate structure with plural TFTs connected in series. In addition, plural TFTs may be connected in parallel so that the channel forming region is substantially divided into plural sections. In the structure of that type, heat radiation can be effected efficiently. The structure is advantageous for protecting the device with it from thermal deterioration.

As in FIG. 18A, the wire to be the gate electrode 37 in the current control TFT 3503 overlaps with the drain wire 40 therein in the region indicated by 3504, via an insulating film therebetween. In this state, the region indicated by 3504 forms a capacitor. The capacitor 3504 functions to retain the voltage applied to the gate electrode in the current control TFT 3503. The drain wire 40 is connected with the current supply line (power line) 3506, from which a constant voltage is all the time applied to the drain wire 40.

On the switching TFT 3502 and the current control TFT 3503, a first passivation film 41 is formed. On the film 41, formed is a planarizing film 42 of an insulating resin. It is extremely important that the difference in level of the layered portions in TFT is removed through planarization with the planarizing film 42. This is because the EL layer to be formed on the previously formed layers in the later step is extremely thin, and if there exist a difference in level of the previously formed layers, the EL device will be often troubled by light emission failure. Accordingly, it is desirable to previously planarize as much as possible the previously formed layers before the formation of the pixel electrode thereon so that the EL layer could be formed on the planarized surface.

The reference numeral 43 indicates a pixel electrode (a cathode in the EL device) of an conductive film with high reflectivity. In this case, it is desirable that an n-channel TFT is used as the current control TFT. The pixel electrode 43 is electrically connected with the drain region in the current control TFT 3503. It is preferable that the pixel electrode 43 is of a low resistance conductive film of an aluminum alloy, a copper alloy or a silver alloy, or of a laminate of those films. Needless to say, the pixel electrode 43 may have a laminate structure with any other conductive films.

In the recess (this corresponds to the pixel) formed between the banks 44a and 44b of an insulating film (preferably of a resin), the light emitting layer 45 is formed. In the illustrated structure, only one pixel is shown, but plural light emitting layers could be separately formed in different pixels, corresponding to different colors of R (red), G (green) and B (blue). The organic EL material for the light emitting layer may be any π-conjugated polymer material. Typical polymer materials usable herein include polyparaphenylenevinylene (PVV) materials, polyvinylcarbazole (PVK) materials, polyfluorene materials, etc.

Various types of PVV type organic EL materials are known, such as those disclosed in H. Shenk, H. Becker, O. Gelsen, E. Klunge, W. Kreuder, and H. Spreitzer; Polymers for Light Emitting Diodes, Euro Display Proceedings, 1999, pp. 33–37 and in Japanese Patent Laid-Open No. 10-92576 (1998). Any of such known materials are usable herein.

Concretely, cyanopolyphenylenevinylenes may be used for red emitting layers; polyphenylenevinylenes may be for green emitting layers; and polyphenylenevinylenes or polyalkylphenylenes may be for blue emitting layers. The thickness of the film for the light emitting layers may fall between 30 and 150 nm (preferably between 40 and 100 nm).

These compounds mentioned above are referred to merely for examples of organic EL materials employable herein and are not limitative at all. The light emitting layer may be combined with a charge transportation layer or a charge injection layer in any desired manner to form the intended EL layer (this is for light emission and for carrier transfer for light emission).

Specifically, this embodiments to demonstrate an embodiment of using polymer materials to form light emitting layers, which, however, is not limitative. Low molecular organic EL materials may also be used for light emitting layers. For charge transportation layers and charge injection layers, further employable are inorganic materials such as silicon carbide, etc. Various organic EL materials 1' and inorganic materials for those layers are known, any of which are usable herein.

In this Embodiment, a hole injection layer 46 of PEDOT (polythiophene) or PAni (polyaniline) is formed on the light emitting layer 45 to give a laminate structure for the EL layer. On the hole injection layer 46, formed is an anode 47 of a transparent conductive film. In this Embodiment, the light having been emitted by the light emitting layer 45 radiates therefrom in the direction toward the top surface (that is, in the upward direction of TFT). Therefore, in this, the anode must transmit light. For the transparent conductive film for the anode, usable are compounds of indium oxide and tin oxide, and compounds of indium oxide and zinc oxide. However, since the anode is formed after the light emitting layer and the hole injection layer having poor heat resistance have been formed, it is preferable that the transparent conductive film for the anode is of a material capable of being formed into a film at as low as possible temperatures.

When the anode 47 is formed, the EL device 3505 is finished. The EL device 3505 thus fabricated herein indicates a capacitor comprising the pixel electrode (cathode) 43, the light emitting layer 45, the hole injection layer 4 and the anode 47. As in FIG. 18A, the region of the pixel electrode 43 is nearly the same as the area of the pixel. Therefore, in this, the entire pixel functions as the EL device. Accordingly, the light utility efficiency of the EL device fabricated herein is high, and the device can display bright images.

In this Embodiment, a second passivation film 48 is formed on the anode 47. For the second passivation film 48, preferably used is a silicon nitride film or a silicon nitride oxide film. The object of the film 48 is to insulate the EL device from the outward environment. The film 48 has the function of preventing the organic EL material from being degraded through oxidation and has the function of preventing it from degassing. With the second passivation film 48 of that type, the reliability of the EL display device is improved.

As described hereinabove, the EL display panel of the invention fabricated in this Embodiment has a pixel portion for the pixel having the constitution as in FIG. 17, and has the switching TFT through which the off current to pass is very small to a satisfactory degree, and the current control TFT resistant to hot carrier injection. Accordingly, the EL display panel fabricated herein has high reliability and can display good images.

The constitution of this Embodiment can be combined with any constitution of Embodiments 1 to 5 in any desired manner. Incorporating the EL display panel of this Embodiment into the electronic appliance of Embodiment 14 as its display portion is advantageous.

[Embodiment 14]

This Embodiment is to demonstrate a modification of the EL display panel of Embodiment 13, in which the EL device 3505 in the pixel portion has a reversed structure. For this Embodiment, referred to is FIG. 19. The constitution of the EL display panel of this Embodiment differs from that illustrated in FIG. 18A only in the EL device portion and the current control TFT portion. Therefore, the description of the other portions except those different portions is omitted herein.

Figure 19:
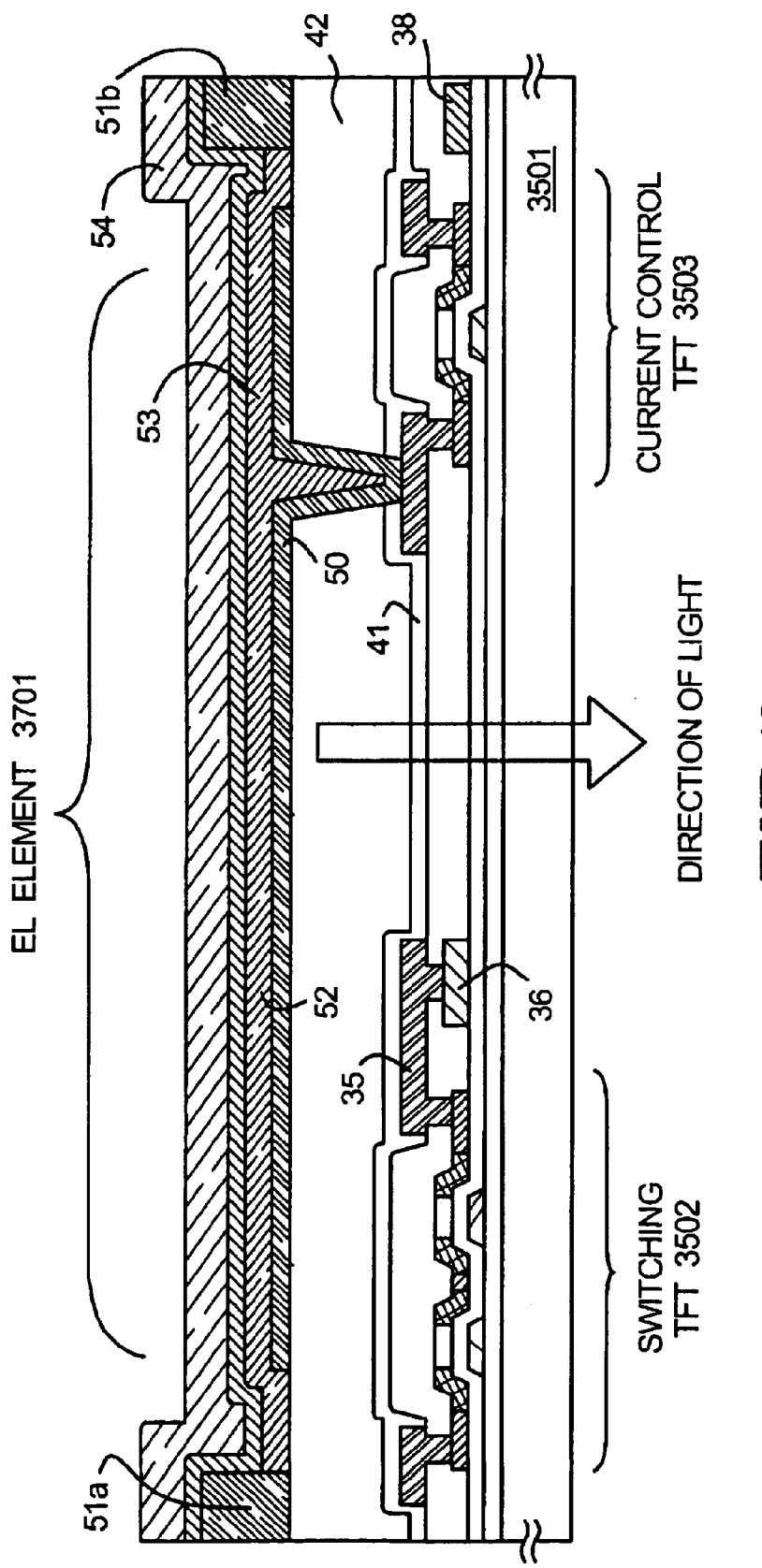
FIG. 19 is a view showing a structure of a pixel portion in an active matrix type EL display panel (Embodiment 14)

In FIG. 19, the current control TFT 3701 may be PTFT fabricated by using the invention. For the process of forming it, referred to is that of Embodiment 1 to 5.

In this Embodiment, the pixel electrode (anode) 50 is of a transparent conductive film. Concretely, used is an conductive film of a compound of indium oxide and zinc oxide. Needless to say, also usable is an conductive film of a compound of indium oxide and tin oxide.

After the banks 51a and 51b of an insulating film have been formed, a light emitting layer 52 of polyvinylcarbazole is formed between them in a solution coating method. On the light emitting layer 52, formed are an electron injection layer 53 of acetylacetonatopotassium, and a cathode 54 of an aluminum alloy. In this case, the cathode 54 serves also as a passivation film. Thus is fabricated the EL device 3701.

In this Embodiment, the light having been emitted by the light emitting layer radiates in the direction toward the substrate with TFT formed thereon, as in the direction of the arrow illustrated.

The constitution of this Embodiment can be combined with any constitution of Embodiments 1 to 5 in any desired manner. Incorporating the EL display panel of this Embodiment into the electronic appliance of Embodiment 14 as its display portion is advantageous.

[Embodiment 15]

This Embodiment is to demonstrate modifications of the pixel with the circuit structure of FIG. 18B. The modifications are as in FIG. 20A to FIG. 20C. In this Embodiment illustrated in those FIG. 20A to FIG. 20C, 3801 indicates the source wire for the switching TFT 3802; 3803 indicates the gate wire for the switching TFT 3802; 3804 indicates a current control TFT; 3805 indicates a capacitor; 3806 and 3808 indicate current supply lines; and 3807 indicates an EL device.

Figure 20A:
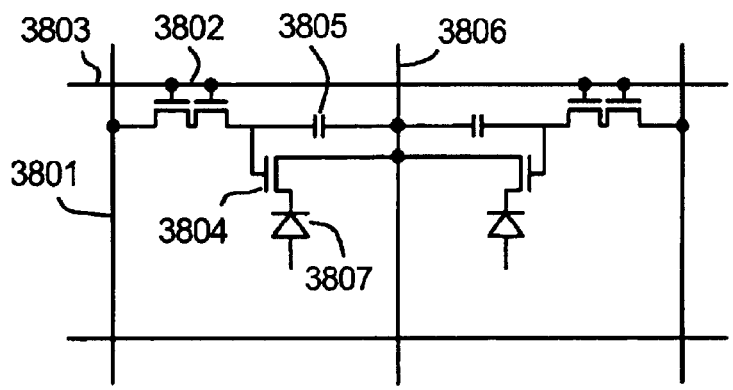
FIGS. 20A to 20C are views showing circuit structures for pixel portions in active matrix type EL display panels (Embodiment 15).

In the embodiment of FIG. 20A, the current supply line 3806 is common to the two pixels. Specifically, this embodiment is characterized in that two pixels are lineal symmetrically formed with the current supply line 3806 being the center between them. Since the number of current supply lines can be reduced therein, this embodiment is advantageous in that the pixel portion can be much finer and thinner.

Figure 20B:
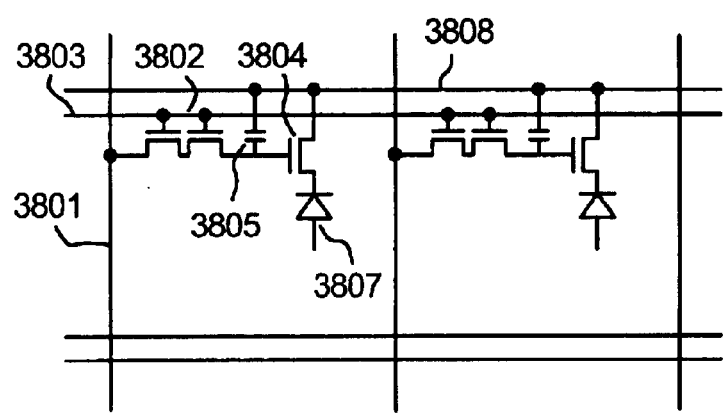

In the embodiment of FIG. 20B, the current supply line 3808 is formed in parallel to the gate wire 3803. Specifically, in this, the current supply line 3808 is so constructed that it does not overlap with the gate wire 3803, but is not limitative. Being different from the illustrated case, the two may overlap with each other via an insulating film therebetween so far as they are of different layers. Since the current supply line 3808 and the gate wire 3803 may enjoy the common exclusive area therein, this embodiment is advantageous in that the pixel pattern can be much finer and thinner.

Figure 20C:
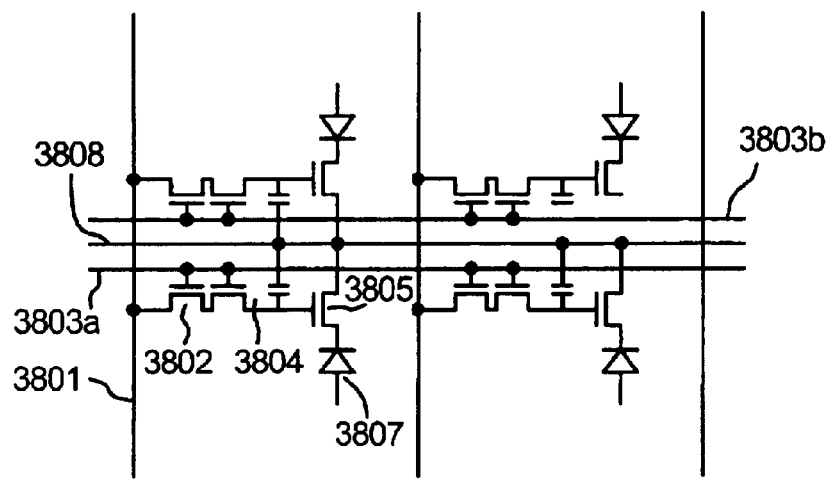

The structure of the embodiment of FIG. 20C is characterized in that the current supply line 3808 is formed in parallel to the gate wires 3803, like in FIG. 20B, and that two pixels are lineal symmetrically formed with the current supply line 3808 being the center between them. In this, it is also effective to provide the current supply line 3808 in such a manner that it overlaps with any one of the gate wires 3803. Since the number of current supply lines can be reduced therein, this embodiment is advantageous in that the pixel pattern can be much finer and thinner.

The constitution of this Embodiment can be combined with any constitution of Embodiment 1 to 5, 11 and 12 in any desired manner. Incorporating the EL display panel having the pixel structure of this Embodiment into the electronic appliance of Embodiment 14 as its display portion is advantageous.

[Embodiment 16]

The embodiment of Embodiment 13 illustrated in FIG. 18A and FIG. 18B is provided with the capacitor 3504 which acts to retain the voltage applied to the gate in the current control TFT 3503. In the embodiment, however, the capacitor 3504 may be omitted.

In the embodiment of Embodiment 13, the current control TFT 3503 is NTFT fabricated by using the invention, as shown in Embodiments 1 to 5. Therefore, in the Embodiment 13, the LDD region is so formed that it overlaps with the gate electrode via the gate insulating film therebetween. In the overlapped region, formed is a parasitic capacitance generally referred to as a gate capacitance. The embodiment of this Embodiment is characterized in that the parasitic capacitance is positively utilized in place of the capacitor 3504.

The parasitic capacitance in question varies, depending on the area in which the gate electrode overlaps with the LDD region, and is therefore determined according to the length of the LDD region in the overlapped area.

Also in the embodiments of Embodiment 15 illustrated in FIG. 20A, FIG. 20B and FIG. 20C, the capacitor 3805 can be omitted.

The constitution of this Embodiment can be combined with any constitution of Embodiment 1 to 5, 11 to 15 in any desired manner. Incorporating the EL display panel having the pixel structure of this Embodiment into the electronic appliance of Embodiment 14 as its display portion in advantageous.

Utilization of the present invention makes it possible to form a pattern in a self alignment manner without using an exposure device that involves the use of a photo mask. The fluctuation caused upon positioning of the photo masks is thus does not takes place, reducing fluctuation in characteristic in the TFT. Particularly, when the pattern formation method of the present invention, that is a self alignment method, is employed for a manufacturing method of a bottom gate type TFT, an LDD region and offset region of desired size may be formed on a gate wiring.

In addition, utilization of the present invention can cause light to round and reach a given spot in a short period of time. Therefore, a pattern may be formed on the inside above the wiring, even if the wiring is minute.

What is claimed is:

1. A method of manufacturing a semiconductor device comprising steps of:
   forming a gate electrode over a front side of a substrate;
   forming a semiconductor film over said gate electrode with a gate insulating film interposed therebetween;
   forming a photosensitive film over said semiconductor film;
   providing a reflecting plate apart from a surface of said photosensitive film by a predetermined distance;
   providing a light source for emitting a light adjacent to a back side of said substrate; and
   exposing said photosensitive film by irradiating from the back side of said substrate with said light emitted from said light source using said gate electrode as a mask and said reflecting plate for reflecting said light having penetrated through said photosensitive film thereby said photosensitive film is irradiated from said front side of said substrate with the light.

2. The method according to claim 1, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

3. A method of manufacturing a semiconductor device, comprising steps of:
   forming a pattern comprising a light-shielding film over a front side of a light transmissive substrate;
   forming a photosensitive film over said pattern;
   providing a light source for emitting a light adjacent to a back side of said light transmissive substrate;
   reflecting or scattering by a reflecting means the light from the light source which has penetrated through said photosensitive film, and thereby irradiating said photosensitive film with the light from the front side of said light transmissive substrate to expose the photosensitive film; and
   developing the photosensitive film.

4. The method according to claim 3, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

5. A method of manufacturing a semiconductor device, comprising steps of:
   forming a pattern comprising a light-shielding film over a front side of a light transmissive substrate;
   forming a photosensitive film over said pattern;
   providing a light source for emitting a light adjacent to a back side of said light transmissive substrate;
   exposing said photosensitive film by irradiating from the back side of said light transmissive substrate with the light emitted from the light source, while using said pattern as a mask;
   reflecting or scattering by a reflecting means the light from the light source which has penetrated through said photosensitive film, so that said photosensitive film is irradiated from the front side of said light transmissive substrate with the light and is exposed; and
   developing the photosensitive film.

6. The method according to claim 5, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

7. A method of manufacturing a semiconductor device, comprising steps of:
   forming a gate wiring over a front side of a light transmissive substrate;
   forming a gate insulating film on said gate wiring;
   forming a semiconductor film on said gate insulating film;
   forming a photosensitive film over said semiconductor film;
   providing a light source for emitting a light adjacent to a back side of said light transmissive substrate:
   exposing said photosensitive film by irradiating from the back side of said light transmissive substrate with the light emitted from a light source while using said gate wiring as a first mask; and
   reflecting or scattering by a reflecting means the light from the light source, which has penetrated through said photosensitive film, so that said photosensitive film is irradiated from the front side of said light transmissive substrate with the light and is exposed;
   removing an exposed part of the photosensitive film to form a pattern comprising the photosensitive film; and
   doping said semiconductor film with dopants for imparting conductivity using said pattern comprising the photosensitive film as a second mask.

8. The method according to claim 7, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

9. A method of manufacturing a semiconductor device, comprising steps of:
   forming a gate wiring over a front side of a light transmissive substrate;
   forming a gate insulating film on said gate wiring;
   forming a semiconductor film on said gate insulating film;
   forming an insulating film on said semiconductor film;
   forming a photosensitive film on said insulating film;
   providing a light source for emitting a light adjacent to a back side of said light transmissive substrate;
   exposing said photosensitive film by irradiating from the back side of said light transmissive substrate with the light emitted from the light source while using said gate wiring as a first mask;
   reflecting or scattering by a reflecting means the light from the light source which has penetrated through said photosensitive film, so that said photosensitive film is irradiated from the front side of said light transmissive substrate with the light and is exposed;

removing an exposed part of the photosensitive film to form a first pattern comprising the photosensitive film;

selectively removing said insulating film using said first pattern as a second mask to form a second pattern comprising said insulating film;

removing said first pattern comprising the photosensitive film; and doping said semiconductor film with dopants for imparting a conductivity using said second pattern comprising the insulating film as a third mask.

10. The method according to claim 9, wherein said first pattern is small in size as compared to said gate wiring.

11. The method according to claim 9, wherein the shape of said first pattern comprising the photosensitive film corresponds to a reduced shape of said gate wiring.

12. The method according to claim 9, wherein said reflecting means is a reflecting plate on which a film comprising a reflective material is formed.

13. The method according to claim 9, wherein said insulating film contains at least one selected from the group consisting of a silicon nitride film, a silicon oxide nitride film, a silicon oxide film and an organic resin film.

14. The method according to claim 9, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

15. A method of manufacturing a semiconductor device, comprising steps of:

forming a gate wiring over a front side of a light transmissive substrate;

forming a gate insulating film on said gate wiring;

forming a semiconductor film on said gate insulating film;

forming an insulating film on said semiconductor film;

forming a photosensitive film on said insulating film;

providing a light source for emitting a light adjacent to a back side of said light transmissive substrate; exposing said photosensitive film by irradiating from the back side of said light transmissive substrate with the light emitted from the light source while using said gate wiring as a first mask;

reflecting or scattering by a reflecting means the light from the light source which has penetrated through said photosensitive film, so that said photosensitive film is irradiated from the front side of said light transmissive substrate with the light and is exposed;

removing an exposed part of the photosensitive film to form a first pattern comprising the photosensitive film;

selectively removing said insulating film using said first pattern as a second mask to form a second pattern comprising said insulating film;

removing said first pattern comprising the photosensitive film; and doping said semiconductor film with dopants for imparting a conductivity using said second pattern comprising the insulating film as a third mask.

16. The method according to claim 15, wherein said first pattern is small in size as compared to said gate wiring.

17. The method according to claim 15, wherein the shape of said first pattern comprising the photosensitive film corresponds to a reduced shape of said gate wiring.

18. The method according to claim 15, wherein said reflecting means is a reflecting plate on which a film comprising a reflective material is formed.

19. The method according to claim 15, wherein said insulating film contains at least one selected from the group consisting of a silicon nitride film, a silicon oxide nitride film, a silicon oxide film and an organic resin film.

20. The method according to claim 15, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

21. A method of manufacturing a semiconductor device, comprising steps of:

forming a gate wiring over a front side of a light transmissive substrate;

forming a gate insulating film on said gate wiring;

forming a semiconductor film on said gate insulating film;

forming an insulating film on said semiconductor film;

forming a first photosensitive film on said insulating film;

providing a light source for emitting lights adjacent to a back side of said light transmissive substrate;

exposing said first photosensitive film by irradiating from the back side of said light transmissive substrate with a first light emitted from the light source while using said gate wiring as a first mask;

reflecting or scattering by a first reflecting means the first light from the light source which has penetrated through said first photosensitive film, so that said first photosensitive film is irradiated with the first light from the front side of said light transmissive substrate and is exposed;

removing an exposed part the first photosensitive film to form a first pattern comprising the first photosensitive film;

selectively removing said insulating film while using said first pattern as a second mask to form a second pattern comprising the insulating film;

removing said first pattern comprising said first photosensitive film;

forming a second photosensitive film;

exposing said second photosensitive film by irradiating from the back side of said light transmissive substrate with a second light emitted from the light source while using said gate wiring as a third mask;

reflecting or scattering by a second reflecting means the second light from the light source which has penetrated through said second photosensitive film, so that said second photosensitive film is irradiated with the second light from the front side of said light transmissive substrate and is exposed;

removing an exposed part of the second photosensitive film to form a third pattern comprising the second photosensitive film;

doping with a high concentration of dopants for imparting conductivity while using said second pattern and said third pattern as masks;

removing said third pattern; and doping a low concentration of dopants for imparting conductivity while using said second pattern as a fourth mask.

22. The method according to claim 21, wherein said third pattern is small in size as compared to said gate wiring, and is larger than said first pattern.

23. The method according to claim 21, wherein the shape of said first pattern comprising the first photosensitive film corresponds to a reduced shape of said gate wiring.

24. The method according to claim 21, wherein each of said first reflecting means and said second reflecting means is a reflecting plate on which a film comprising a reflective material is formed.

25. The method according to claim 21, wherein said insulating film contains at least one selected from the group consisting of a silicon nitride film, a silicon oxide nitride film, a silicon oxide film and an organic resin film.

26. The method according to claim 2, wherein said semiconductor device is one selected from the group consisting of a video camera, a digital camera, a head mount display, a goggle type display, an wearable display, a navigation system for vehicles, a personal computer, a portable information terminal, a mobile computer, a cellular phone, and an electronic book.

27. A method of manufacturing a semiconductor device, comprising steps of:

forming a pattern comprising a light-shielding film over a front side of a light transmissive substrate;

forming a photosensitive film over said pattern;

providing a reflecting means over the front side of said light transmissive substrate;

providing a light source for emitting a light adjacent to the back side of said light transmissive substrate; and exposing said photosensitive film by irradiating from the back side of said light transmissive substrate with said light emitted from said light source while using said pattern as a mask, wherein said reflecting means reflects said light passing through said photosensitive film, thereby said photosensitive film is irradiated from the front side of said light transmissive substrate with the light and is exposed.

28. A method of manufacturing a semiconductor device, comprising steps of:

forming a pattern comprising a light-shielding film over a front side of a light transmissive substrate;

forming a photosensitive film over said pattern;

providing a light source for emitting a light adjacent to the back side of said light transmissive substrate;

exposing said photosensitive film by irradiating from the back side of said light transmissive substrate with the light emitted from the light source while using said pattern as a mask; and reflecting or scattering by a reflecting means the light from the light source which has penetrated through said photosensitive film, so that said photosensitive film is irradiated from the front side of said light transmissive substrate with the light and is exposed.

29. The method according to claim 28, wherein a shape of the photosensitive film formed over said pattern corresponds to a reduced shape of said pattern comprising the light-shielding film.

* * * * *